(12) United States Patent
Ahn et al.

(10) Patent No.: US 12,727,096 B2
(45) Date of Patent: Sep. 1, 2026

(54) ELECTRONIC DEVICE INCLUDING DISPLAY DEVICE HAVING IMPROVED IMPACT RESISTANCE

(71) Applicant: Samsung Display Co., LTD., Yongin-si (KR)

(72) Inventors: Jaeho Ahn, Yongin-si (KR); Cheol Jang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 234 days.

(21) Appl. No.: 18/510,301

(22) Filed: Nov. 15, 2023

(65) Prior Publication Data

US 2024/0306327 A1 Sep. 12, 2024

(30) Foreign Application Priority Data

Mar. 10, 2023 (KR) ........................ 10-2023-0032077

(51) Int. Cl.
*H05K 5/02* (2006.01)
*G06F 1/16* (2006.01)

(52) U.S. Cl.
CPC ......... *H05K 5/0217* (2013.01); *G06F 1/1652* (2013.01)

(58) Field of Classification Search
CPC ... H05K 5/0217; G06F 1/1626; G06F 1/1656; G06F 1/1652
See application file for complete search history.

(56) References Cited

U.S. PATENT DOCUMENTS

| | | | | |
|---|---|---|---|---|
| 11,493,956 | B2 | 11/2022 | Kang et al. | |
| 2020/0170114 | A1* | 5/2020 | Choi | G09F 9/301 |
| 2021/0007230 | A1* | 1/2021 | Kang | H05K 1/18 |
| 2022/0029124 | A1* | 1/2022 | Kang | H10K 50/841 |
| 2022/0269312 | A1* | 8/2022 | Choi | G06F 1/1652 |
| 2022/0357775 | A1* | 11/2022 | Choi | G06F 1/1652 |
| 2023/0315155 | A1* | 10/2023 | Ahn | G06F 1/1637 |
| 2024/0164030 | A1* | 5/2024 | Lee | G09F 9/301 |

FOREIGN PATENT DOCUMENTS

| | | | |
|---|---|---|---|
| CN | 112991933 | A | 6/2021 |
| CN | 115132095 | A | 9/2022 |
| KR | 1020210041665 | A | 4/2021 |
| KR | 1020220008732 | A | 1/2022 |
| KR | 1020220096227 | A | 7/2022 |

* cited by examiner

*Primary Examiner* — Sagar Shrestha
(74) *Attorney, Agent, or Firm* — CANTOR COLBURN LLP

(57) ABSTRACT

An electronic device includes a display module that is rolled or bent with respect to a virtual axis extending in a first direction, first and second lower support bars arranged below the display module, a first impact absorbing member disposed between the display module and the first lower support bar, and a second impact absorbing member disposed between the display module and the second lower support bar. In a state in which the display module is unfolded, each of the first lower support bar and the second lower support bar extends in a second direction intersecting the first direction, the first lower support bar overlaps a first side of the display module extending in the second direction, and the second lower support bar overlaps a second side of the display module opposite to the first side of the display module and extending in the second direction.

20 Claims, 23 Drawing Sheets

EDa
C-OPa
DDa
I'
I
CS1
CS2
CSa
DR1
DR2
DR3

FIG. 14B

CS1
CSa
CS2
II'
II
DR1
DR2
DR3
EDa
C-OPa
DDa

FIG. 16B

ELECTRONIC DEVICE INCLUDING DISPLAY DEVICE HAVING IMPROVED IMPACT RESISTANCE

This application claims priority to Korean Patent Application No. 10-2023-0032077, filed on Mar. 10, 2023, and all the benefits accruing therefrom under 35 U.S.C. § 119, the content of which in its entirety is herein incorporated by reference.

BACKGROUND

1. Field

Embodiments of the disclosure described herein relate to an electronic device, and more particularly, to an electronic device including a display device.

2. Description of the Related Art

Electronic devices such as smart phones, digital cameras, laptop computers, navigation devices, and smart televisions that provide images to users include display devices for displaying images. The display devices generate images and provide the images to the users through display screens.

In recent years, with the technological development of the display devices, various types of display devices are being developed. Various flexible display devices that may be deformed into a curved shape or folded or rolled have been developed, for example. The flexible display devices may be easily carried and improve user convenience.

SUMMARY

Embodiments of the disclosure provide a display device having improved impact resistance and an electronic device including the same.

In an embodiment of the disclosure, an electronic device includes a display module that is rolled or bent with respect to a virtual axis extending in a first direction, a first lower support bar and a second lower support bar, each of which is disposed below the display module, a first impact absorbing member disposed between the display module and the first lower support bar, and a second impact absorbing member disposed between the display module and the second lower support bar, where in a state in which the display module is unfolded, each of the first lower support bar and the second lower support bar may extend in a second direction intersecting the first direction, the first lower support bar may overlap a first side of the display module extending in the second direction, and the second lower support bar may overlap a second side of the display module opposite to the first side of the display module and extending in the second direction.

In an embodiment, the first impact absorbing member and the second impact absorbing member may have smaller modulus values than modulus values of the first lower support bar and the second lower support bar.

In an embodiment, each of the first impact absorbing member and the second impact absorbing member may include any one of a porous material, rubber, and a spring.

In an embodiment, the first lower support bar and the second lower support bar may provide inner spaces, and at least a portion of the first impact absorbing member may be disposed in the inner space of the first lower support bar, and at least a portion of the second impact absorbing member may be disposed in the inner space of the second lower support bar.

In an embodiment, the first impact absorbing member may overlap the first lower support bar, and the second impact absorbing member may overlap the second lower support bar.

In an embodiment, when the display module rolls, the display module may include a display panel, and an upper support member disposed below the display panel, and the upper support member may include a base part and upper support bars that contact the base part, extend in the first direction, and are arranged in the second direction.

In an embodiment, an upper surface of each of the upper support bars, a lower surface opposite to the upper surface, and side surfaces that connect the upper surface and the lower surface and extend in the first direction may contact the base part.

In an embodiment, an upper surface of each of the upper support bars may contact the base part, and side surfaces of each of the upper support bars extending in the first direction may be exposed from the base part.

In an embodiment, the first impact absorbing member and the second impact absorbing member may have smaller modulus values than modulus values of the base part.

In an embodiment, when the display module rolls, the first lower support bar may include support parts and at least one hinge part connecting the support parts, in a state in which the display module is rolled, the support parts may extend in the first direction and be arranged in the second direction, and in the state in which the display module is unfolded, the support parts may extend in the second direction and be arranged in the second direction.

In an embodiment, when the display module rolls, each of the first impact absorbing member and the second impact absorbing member may be attached to the display module and roll together with the display module.

In an embodiment, when the display module is bent, the display module may include a first area bent with respect to the virtual axis extending in the first direction and a second area that extends from the first area and is flat and include a display panel and an upper support member disposed below the display panel, the upper support member may include a first support layer defining openings therein and overlapping the first area, a second support layer overlapping the second area, and upper support bars that extend in the first direction, are arranged in the second direction, overlap the first area, and are arranged below the first support layer, and in the state in which the display module is unfolded, the first and second lower support bars and the first and second impact absorbing members may overlap the first area.

In an embodiment, the electronic device may further include a third lower support bar and a fourth lower support bar that overlap the second area, are arranged below the second support layer, and extend in the second direction intersecting the first direction, a third impact absorbing member disposed between the display module and the third lower support bar, and a fourth impact absorbing member disposed between the display module and the fourth lower support bar, where the third lower support bar may overlap a first side of the display module in the second area, the first side of the display module may extend in the second direction, the fourth lower support bar may overlap a second side of the display module in the second area, and the second side of the display module may be opposite to the first side of the display module and extend in the second direction.

In an embodiment, the electronic device may further include a case, and a roller which is disposed inside the case and rotates about the virtual axis and to which one side of the display module is connected, where the case may include a first case in which the roller is accommodated, and a second case that is coupled to the first case and moves closer to or farther from the first case, the first lower support bar and the second lower support bar may be connected to the first case, and the third lower support bar and the fourth lower support bar may be connected to the second case.

In an embodiment, an electronic device includes a display panel that is rolled or bent with respect to a virtual axis extending in a first direction, an upper support member disposed below the display panel and including a plurality of upper support bars extending in the first direction and arranged in a second direction intersecting the first direction, a first lower support bar and a second lower support bar, each of which is disposed below the upper support member, a first impact absorbing member disposed between the upper support member and the first lower support bar, and a second impact absorbing member disposed between the upper support member and the second lower support bar, where in a state in which the display panel is unfolded, each of the first lower support bar and the second lower support bar may extend in the second direction, the first lower support bar may overlap at least some of one ends of the plurality of upper support bars, and the second lower support bar may overlap some of the other ends of the plurality of upper support bars.

In an embodiment, the first impact absorbing member and the second impact absorbing member may have smaller modulus values than modulus values of the first lower support bar and the second lower support bar.

In an embodiment, each of the first impact absorbing member and the second impact absorbing member may include any one of a porous material, rubber, and a spring.

In an embodiment, the first impact absorbing member may overlap the first lower support bar, and the second impact absorbing member may overlap the second lower support bar.

In an embodiment, when the display panel rolls, the upper support member may further include a base part of which at least a portion is disposed on the plurality of upper support bars and which contacts the plurality of upper support bars, and the plurality of upper support bars may have greater modulus values than a modulus value of the base part.

In an embodiment, when the display panel is bent, the display panel may include a first area bent with respect to the virtual axis extending in the first direction and a second area that extends from the first area and is flat, the plurality of upper support bars overlapping the first area, the upper support member may further include a first support layer having openings defined therein, overlapping the first area, and disposed on the plurality of upper support bars, and a second support layer overlapping the second area, and in a state in which the display panel is unfolded, each of the first and second lower support bars and the first and second impact absorbing members may overlap the first area.

BRIEF DESCRIPTION OF THE DRAWINGS

The above and other embodiments, advantages and features of the disclosure will become apparent by describing in detail embodiments thereof with reference to the accompanying drawings.

FIGS. 10A and 10B are perspective views of an electronic device according to the disclosure.

Figure 14A:
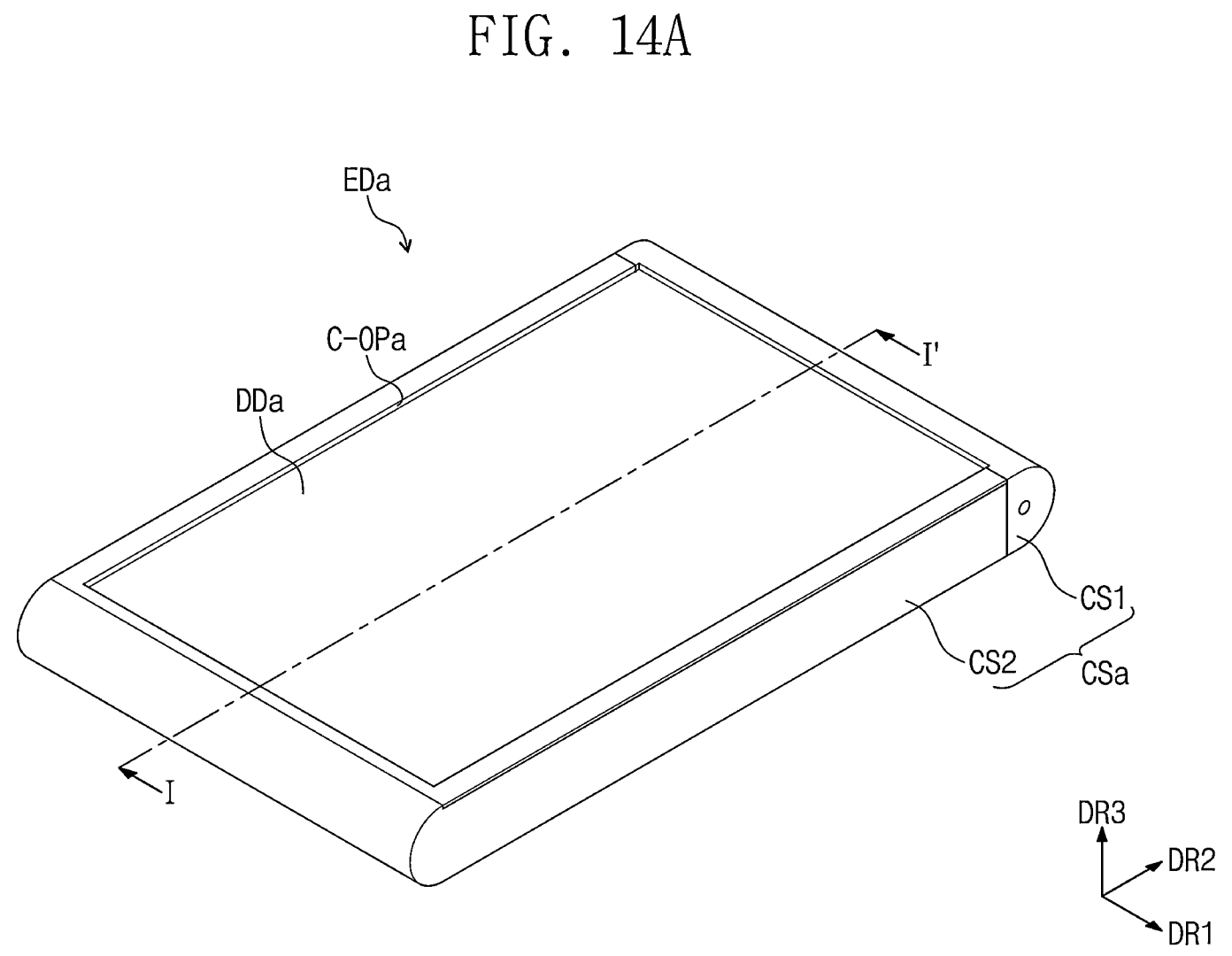
Figure 14B:
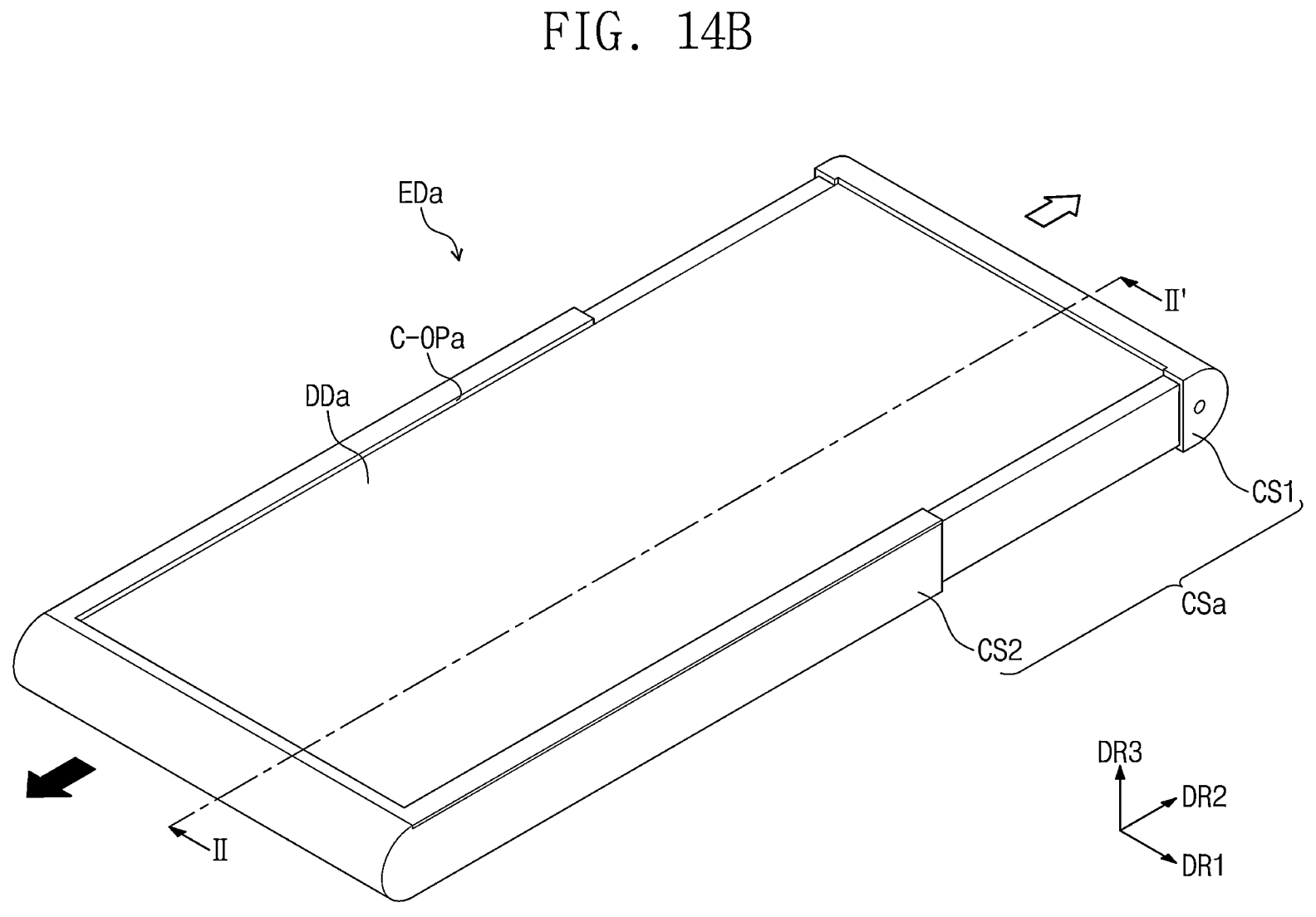

FIGS. 14A and 14B are perspective views of an embodiment of the electronic device according to the disclosure.

FIG. 16B is a cross-sectional view of an embodiment of the electronic device in an embodiment, which corresponds to line II-II' of FIG. 14B.

DETAILED DESCRIPTION

Figure 1A:
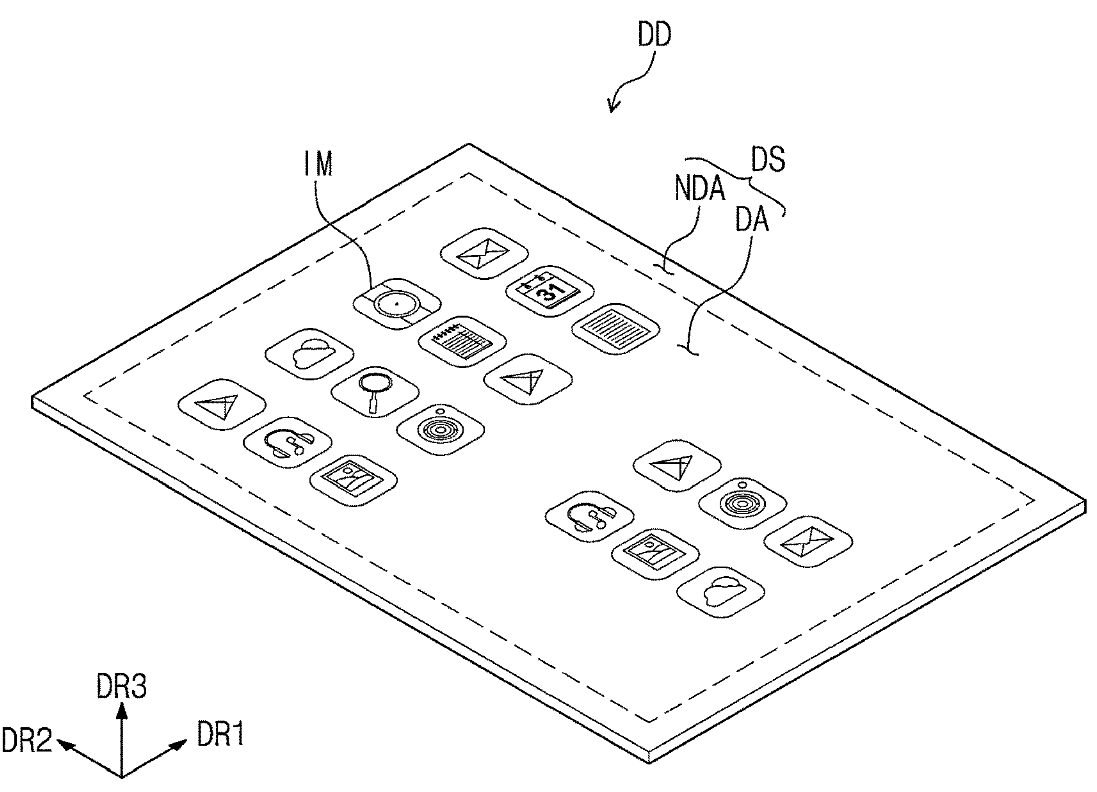
FIGS. 1A and 1B are perspective views of an embodiment of a display device according to the disclosure.

In the specification, the expression that a first component (or an area, a layer, a part, a portion, etc.) is "disposed on", "connected with" or "coupled to" a second component means that the first component is directly disposed on/connected with/coupled to the second component or means that a third component is interposed therebetween.

The same reference numerals refer to the same components. Further, in the drawings, the thickness, the ratio, and the dimension of components are exaggerated for effective description of technical contents. The term "and/or" includes all combinations of one or more components that may be defined by associated components.

Although the terms "first", "second", etc. may be used to describe various components, the components should not be limited by the terms. The terms are only used to distinguish one component from another component. For example, without departing from the right scope of the present disclosure, a first component may be referred to as a second component, and similarly, the second component may be also referred to as the first component. Singular expressions include plural expressions unless clearly otherwise indicated in the context.

Also, the terms "under", "below", "on", "above", etc. are used to describe the correlation of components illustrated in drawings. The terms that are relative in concept are described based on a direction illustrated in drawings.

It will be understood that the terms "include", "comprise", "have", etc. specify the presence of features, numbers, steps, operations, elements, or components, described in the specification, or a combination thereof, and do not exclude in advance the presence or additional possibility of one or more other features, numbers, steps, operations, elements, or components or a combination thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within +30%, 20%, 10%, 5% of the stated value, for example.

Unless otherwise defined, all terms (including technical terms and scientific terms) used in the specification have the same meaning as commonly understood by those skilled in the art to which the disclosure belongs. Furthermore, terms such as terms defined in the dictionaries commonly used should be interpreted as having a meaning consistent with the meaning in the context of the related technology and should not be interpreted in overly ideal or overly formal meanings unless explicitly defined herein.

Hereinafter, embodiments of the disclosure will be described with reference to accompanying drawings.

Figure 1B:
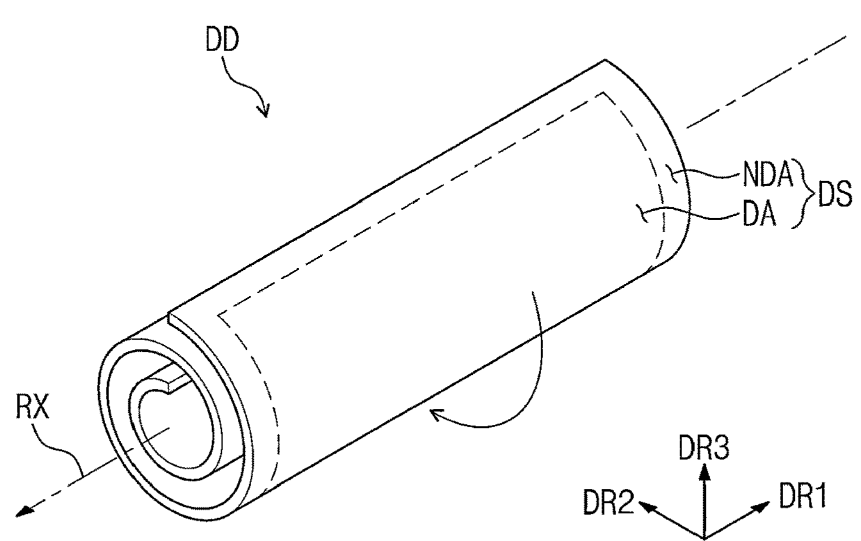

FIG. 1A is a perspective view of an embodiment of a display device DD according to the disclosure. FIG. 1B is a perspective view illustrating the display device DD illustrated in FIG. TA in a rolling state.

The display device DD may be a device that is activated according to an electrical signal to display an image. In an embodiment, the display device DD may be included in large-sized devices such as televisions and billboards as well as small and medium-sized devices such as monitors, mobile phones, tablet computers, navigation devices, and game machines, for example. An embodiment of the display device DD is not limited thereto without departing from the concept of the disclosure.

The display device DD in an embodiment may be flexible. The wording "flexible" may mean a property that may be bent and may include a completely foldable structure as well as a structure that may be bent by several nanometers. In an embodiment, the flexible display device DD may include a rollable display device that rolls about a virtual axis, for example. FIG. 1A illustrates the display device DD in an unfolded state, and FIG. 1B illustrates the display device DD in a rolling state.

Referring to FIG. 1A, the display device DD in an unfolded state have may have a quadrangular shape, e.g., rectangular shape having short sides extending in a first direction DR1 and long sides extending in a second direction DR2 intersecting the first direction DR1 in a plan view. However, the disclosure is not limited thereto, and the display device DD may have various shapes such as a circle and a polygon.

The display device DD may generate an image IM in response to the electrical signal and provides the image IM to a user through a display surface DS. The display device DD in an unfolded state may display the image IM in a third direction DR3 on the display surface DS parallel to the first direction DR1 and the second direction DR2. The display surface DS on which the image IM is displayed may correspond to a front surface of the display device DD.

The image IM provided by the display device DD may include a still image as well as a dynamic image. FIG. 1A illustrates a plurality of icons in an embodiment of the image IM.

A front surface (or an upper surface) and a rear surface (or a lower surface) of each of members constituting the display device DD may be opposite to each other in the third direction DR3, and a normal direction of each of the front surface and the rear surface may be substantially parallel to the third direction DR3. A separation distance between the front surface and the rear surface defined in the third direction DR3 may correspond to a thickness of a member (or a unit).

In the specification, the wording "in a plan view" may be defined as a state viewed in the third direction DR3. In the specification, the wording "in a cross-section" may be defined as a state viewed from the first direction DR1 or the second direction DR2. Directions indicated by the first to third directions DR1, DR2, and DR3 are relative concepts and may be changed to other directions.

The display surface DS of the display device DD may include a display area DA and a peripheral area NDA. The display area DA may be an area on which the image IM is displayed, and the peripheral area NDA may be an area on which the image IM is not displayed. The peripheral area NDA may be provided as an area having a light transmittance lower than that of the display area DA and having a predetermined color.

The peripheral area NDA may be adjacent to the display area DA. In an embodiment, the peripheral area NDA may surround the display area DA and define an edge of the display device DD, for example. However, the disclosure is not limited thereto, and the peripheral area NDA may be disposed adjacent to only one side of the display area DA or omitted. In an alternative embodiment, the peripheral area NDA may be disposed not on a front surface but on a side surface of the display device DD.

Referring to FIG. 1B, the display device DD may roll about a virtual rolling axis RX (hereinafter, also referred to as a rolling axis RX or a virtual axis RX) extending in one direction. In an embodiment, the display device DD may roll about the rolling axis RX extending in the first direction DR1, for example. FIG. 1B illustratively illustrates the rolling axis RX extending in the first direction DR1 parallel to the short sides of the display device DD, but the disclosure is not limited thereto, and the display device DD may roll about the rolling axis RX parallel to the long sides of the display device DD.

The display device DD may roll so that the display surface DS faces the outside. As the display device DD rolls, the display device DD may be easily carried. Accordingly, a large-area display device DD may also roll and thus may be accommodated in an accommodation member.

Figure 2A:
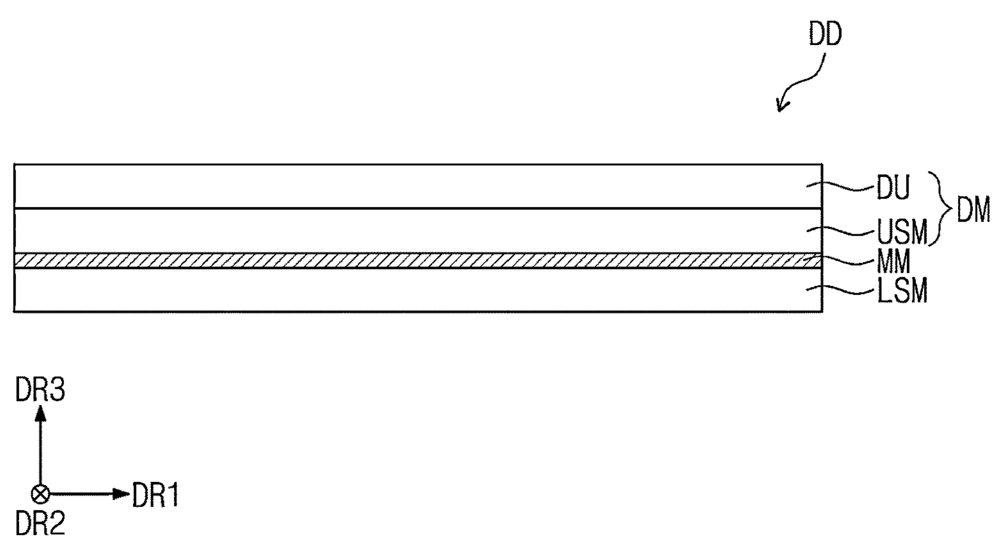
FIG. 2A is a cross-sectional view of an embodiment of the display device according to the disclosure.
Figure 2B:
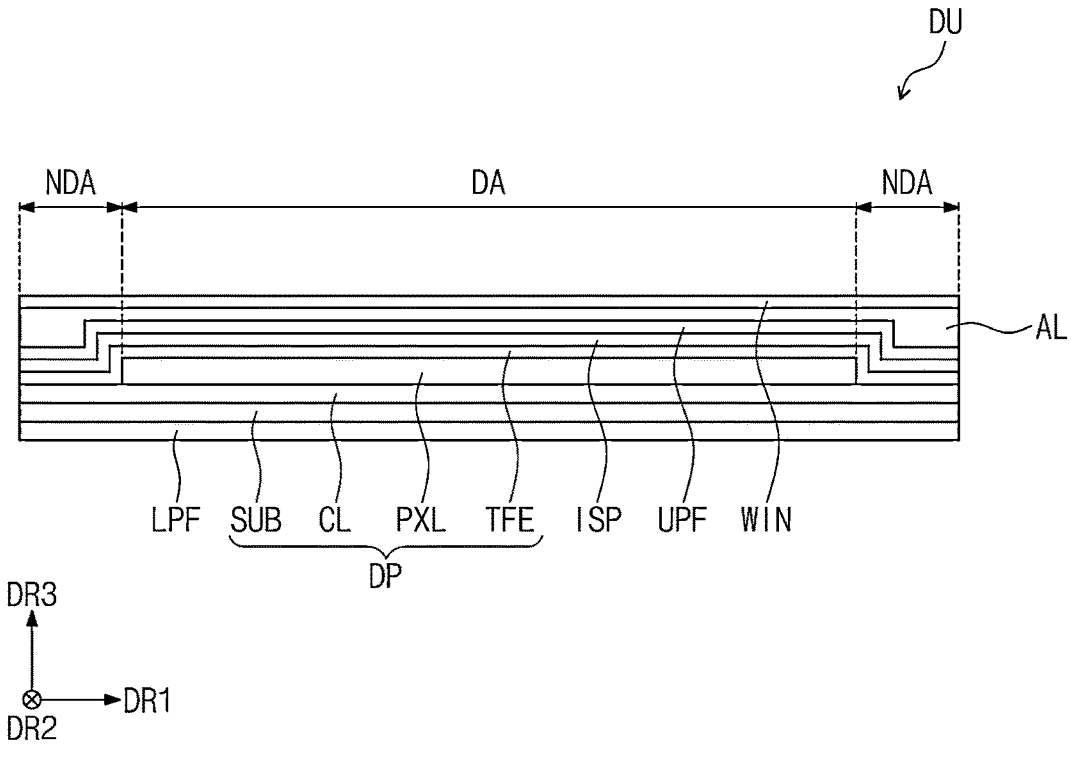
FIG. 2B is a cross-sectional view of an embodiment of a display unit according to the disclosure.

FIG. 2A is a cross-sectional view of an embodiment of the display device DD according to the disclosure. FIG. 2B is a cross-sectional view of an embodiment of a display unit DU according to the disclosure.

Referring to FIGS. 2A and 2B, the display device DD in an embodiment may include the display unit DU, an upper support member USM disposed below the display unit DU, a lower support member LSM disposed below the upper support member USM, and an intermediate member MM disposed between the upper support member USM and the lower support member LSM. In an embodiment, the display unit DU and the upper support member USM may constitute a display module DM.

As illustrated in FIG. 2B, the display unit DU may include a display panel DP, an input detection layer ISP, an upper protective layer UPF, a lower protective layer LPF, an adhesive layer AL, and a window WIN. The display unit DU may be a component that is activated in response to the electrical signal.

The display panel DP may be a flexible display panel. The display panel DP in an embodiment of the disclosure may be a light-emitting display panel, but the disclosure is not particularly limited thereto. In an embodiment, the display panel DP may be an organic light-emitting display panel or inorganic light-emitting display panel, for example. A light-emitting layer of the organic light-emitting display panel may include an organic light-emitting material. A light-emitting layer of the inorganic light-emitting display panel may include an inorganic light-emitting material such as a quantum dot or a quantum rod.

The display panel DP may include a base substrate SUB, a circuit layer CL, a display element layer PXL, and an encapsulation layer TFE. The base substrate SUB, the circuit layer CL, the display element layer PXL, and the encapsulation layer TFE may be sequentially laminated in the third direction DR3.

The base substrate SUB may include the display area DA and the peripheral area NDA, which may correspond to the display area DA and the peripheral area NDA of the display device DD. The base substrate SUB may provide a base surface on which the circuit layer CL is disposed.

The base substrate SUB may include a flexible plastic substrate. In an embodiment, the base substrate SUB may include at least one synthetic resin layer, for example. The synthetic resin layer of the base substrate SUB may include at least one of an acryl-based resin, a methacrylate-based resin, a polyisoprene-based resin, a vinyl-based resin, an epoxy-based resin, a urethane-based resin, a cellulose-based resin, a siloxane-based resin, a polyamide-based resin, a perylene-based resin, and a polyimide-based resin. However, the material of the base substrate SUB is not limited to the above embodiment.

The circuit layer CL may be disposed on the base substrate SUB. The circuit layer CL may include at least one insulating layer, driving elements, signal lines, and signal pads. The circuit layer CL may include a conductive pattern and a semiconductor pattern forming the driving elements, the signal lines, and the signal pads. After an insulating layer, a semiconductor layer, and a conductive layer are formed on the base substrate SUB by coating, deposition, or the like, the insulating layer, the semiconductor layer, and the conductive layer are selectively patterned by photolithography, and thus the driving elements, the signal lines, and the signal pads included in the circuit layer CL may be formed.

The display element layer PXL may be disposed on the circuit layer CL. The display element layer PXL may include light-emitting elements disposed to overlap the display area DA. The light-emitting elements of the display element layer PXL may be electrically connected to the driving elements of the circuit layer CL and thus may provide light beams through the display area DA according to signals of the driving elements.

The encapsulation layer TFE may be disposed on the display element layer PXL to seal the light-emitting elements. The encapsulation layer TFE may include a plurality of thin films. The thin films of the encapsulation layer TFE may be arranged to improve optical efficiency of the light-emitting element or to protect the light-emitting element. In an embodiment, the encapsulation layer TFE may include at least one inorganic film and at least one organic film. The inorganic film of the encapsulation layer TFE may protect the light-emitting element from moisture/oxygen. The organic film of the encapsulation layer TFE may protect the light-emitting element from foreign substances such as dust particles.

The input detection layer ISP may be disposed on the display panel DP. The input detection layer ISP may be directly disposed on the display panel DP without a separate adhesive member. That is, after the display panel DP is formed, the input detection layer ISP may be formed on the base surface provided by the display panel DP through a continuous process. In an embodiment, the input detection layer ISP may be directly disposed on the encapsulation layer TFE, for example. However, the disclosure is not limited thereto, and the input detection layer ISP may be manufactured in a panel shape through a separate manufacturing process distinguished from a process of manufacturing the display panel DP and then may be attached to the display panel DP by an adhesive member.

The input detection layer ISP may detect an external input applied from the outside of the display device DD (refer to FIG. 1A) and acquire coordinate information of the external input. The input detection layer ISP may be driven in various manners such as a capacitive manner, a resistive manner, an infrared manner, and a pressure manner, and is not limited to any one thereof.

However, according to the disclosure, the input detection layer ISP may be omitted.

The upper protective layer UPF may be disposed on the input detection layer ISP. The upper protective layer UPF may be coupled to a front surface of the input detection layer ISP by an adhesive member, but the disclosure is not limited thereto, and the upper protective layer UPF may be directly formed on the front surface of the input detection layer ISP.

The lower protective layer LPF may be disposed below the display panel DP. The lower protective layer LPF may be coupled to a rear surface of the display panel DP by an adhesive member, but the disclosure is not limited thereto, and the lower protective layer LPF may be directly formed on the rear surface of the display panel DP.

Each of the upper protective layer UPF and the lower protective layer LPF may include at least one of a protective film layer and an impact absorbing layer that protect the display panel DP and the input detection layer ISP from external impact.

Each of the upper protective layer UPF and the lower protective layer LPF may include a flexible polymer material such as polyethylene terephthalate and polyimide. The impact absorbing layer may include a material such as sponge, expanded foam, and urethane resin and may absorb an impact applied to the display panel DP and the input detection layer ISP. Shapes of the upper protective layer UPF and the lower protective layer LPF are not limited to an embodiment as long as the upper protective layer UPF and the lower protective layer LPF may protect the display panel DP and the input detection layer ISP.

The adhesive layer AL may be disposed on the upper protective layer UPF. The adhesive layer AL may be disposed between the upper protective layer UPF and the window WIN to couple the upper protective layer UPF and the window WIN. The adhesive layer AL may include a transparent adhesive such as an optically clear adhesive ("OCA") film, an optically clear resin ("OCR") or a pressure sensitive adhesive ("PSA") film. However, the type of adhesive included in the adhesive layer AL is not limited thereto.

The window WIN may be disposed on the upper protective layer UPF. The window WIN may cover an entirety of the outer side of the display panel DP, the input detection layer ISP, and the upper protective layer UPF and may protect the other components of the display unit DU from external impacts and scratches.

The window WIN may include an optically transparent insulating material. In an embodiment, the window WIN may include a glass, a sapphire, or a polymer, for example. The window WIN may have a single-layer structure or a multi-layer structure. The window WIN may further include functional layers, such as an anti-fingerprint layer, a phase control layer, and a hard coating layer, which are arranged on an optically transparent substrate.

The upper support member USM may be disposed below the display unit DU to support the display unit DU and may roll together with the display unit DU. The upper support member USM may be attached to a rear surface of the display unit DU. In an embodiment, the upper support member USM may be attached to the rear surface of the display unit DU through a separate adhesive layer, for example. The upper support member USM may provide a flat surface to the display unit DU to prevent degradation of surface quality of the display unit DU.

The lower support member LSM may be disposed below the upper support member USM to support the display unit DU and the upper support member USM. The lower support member LSM may be coupled to the upper support member USM and may roll together with the display unit DU. However, the disclosure is not limited thereto, and the lower support member LSM may not be coupled to the upper support member USM, may be provided independently, and thus may not roll.

The intermediate member MM may be disposed between the upper support member USM and the lower support member LSM to absorb an external impact provided to the display module DM disposed on the upper side. Thus, the display module DM may have a predetermined impact resistance, and thus the display module DM may be prevented from being damaged by an external impact.

Figure 3:
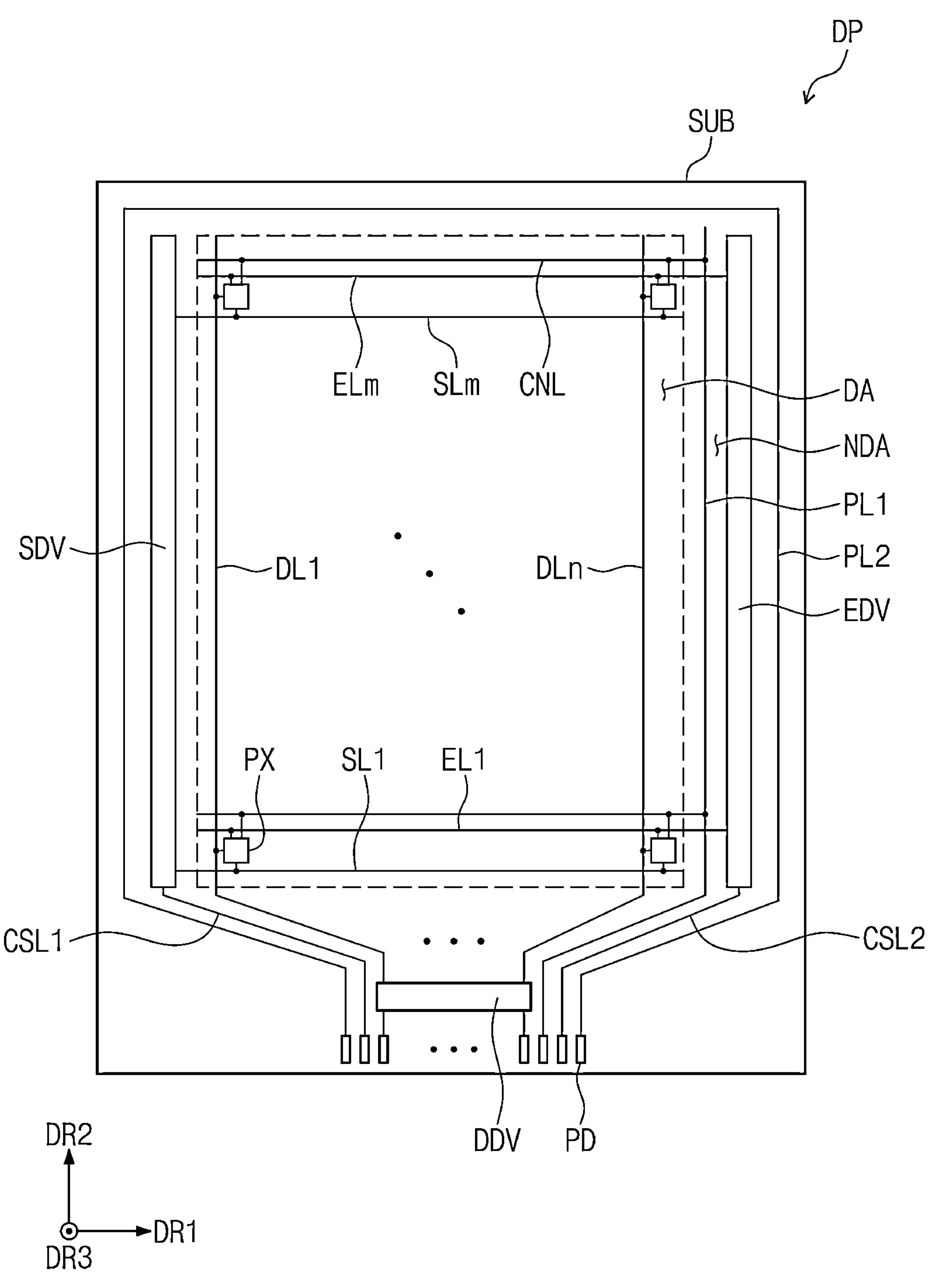
FIG. 3 is a plan view of an embodiment of the display panel according to the disclosure.

Referring to FIG. 3, the display panel DP may include the base substrate SUB, a plurality of pixels PX, a plurality of signal lines SL1 to SLm, DL1 to DLn, EL1 to ELm, CSL1, CSL2, PL1, PL2, and CNL electrically connected to the pixels PX, a scan driver SDV, a data driver DDV, and an emission driver EDV. Here, "m" and "n" are natural numbers.

As described above, the base substrate SUB may include the display area DA and the peripheral area NDA. The base substrate SUB may provide a base surface on which electrical elements and wiring lines of the display panel DP are arranged. FIG. 3 illustratively illustrates the base substrate SUB having a quadrangular shape, e.g., rectangular shape parallel to the first direction DR1 and the second direction DR2 in a plan view, but the disclosure is not limited thereto, and the base substrate SUB may be designed in various shapes according to a structure of the display device DD (refer to FIG. 1A).

Each of the pixels PX may include a pixel driving circuit including a light-emitting element, a plurality of transistors (e.g., switching transistors, driving transistors, or the like) connected to the light-emitting element, and at least one capacitor. Each of the pixels PX may emit a light beam in response to an electrical signal applied to the pixel PX.

The pixels PX may be arranged in the display area DA. However, this is illustratively illustrated, some of the pixels PX may include thin film transistors arranged in the peripheral area NDA, and the disclosure is not limited to an embodiment.

Each of the scan driver SDV, the data driver DDV, and the emission driver EDV may be arranged in the peripheral area NDA. However, the disclosure is not limited thereto, and in an embodiment, at least one of the scan driver SDV, the data driver DDV, and the emission driver EDV may overlap the display area DA. Accordingly, an area of the peripheral area NDA may be reduced, and thus a bezel area of the display device DD (refer to FIG. 1A) may be reduced.

The data driver DDV may be provided in the form of an integrated circuit chip defined as a driving chip and may be disposed (e.g., mounted) on the peripheral area NDA of the display panel DP. However, the disclosure is not limited thereto, and the data driver DDV may be disposed (e.g., mounted) on a separate flexible circuit board connected to the display panel DP and electrically connected to the display panel DP.

The plurality of signal lines SL1 to SLm, DL1 to DLn, EL1 to ELm, CSL1, CSL2, PL1, PL2, and CNL may include the plurality of scan lines SL1 to SLm, the plurality of data lines DL1 to DLn, the plurality of emission lines EL1 to ELm, the first and second control lines CSL1 and CSL2, the first and second power lines PL1 and PL2, and the connection lines CNL.

The scan lines SL1 to SLm may extend in the first direction DR1 and may be connected to the scan driver SDV. The data lines DL1 to DLn may extend in the second direction DR2 and may be connected to the data driver DDV. The emission lines EL1 to ELm may extend in the first direction DR1 and may be connected to the emission driver EDV.

The first power line PL1 may extend in the second direction DR2 and may be disposed in the peripheral area NDA. The first power line PL1 may be disposed between the display area DA and the emission driver EDV. However, the disclosure is not limited thereto, and the first power line PL1 may be disposed between the display area DA and the scan driver SDV.

The connection lines CNL may extend in the first direction DR1, may be arranged in the second direction DR2, and may be connected to the first power line PL1 and the pixels PX. The connection lines CNL may be arranged in a layer different from the first power line PL1 and electrically connected to the first power line PL1. However, the disclosure is not limited thereto, and the connection lines CNL may be unitary in the same layer as that of the first power line PL1. A first voltage may be applied to the pixels PX through the first power line PL1 and the connection lines CNL connected to each other.

The second power line PL2 may be disposed in the peripheral area NDA. The second power line PL2 may be disposed outside the scan driver SDV and the emission driver EDV. Although not separately illustrated, the second power line PL2 may extend toward the display area DA and may be connected to the pixels PX. A second voltage having a lower level than the first voltage may be applied to the pixels PX through the second power line PL2. The first voltage and the second voltage may be applied to electrodes of the light-emitting element of the pixel PX, and accordingly, the light-emitting element may generate and emit a light beam.

The first control line CSL1 may be connected to the scan driver SDV. The second control line CSL2 may be connected to the emission driver EDV.

Pads PD may be arranged to be adjacent to a lower end of the peripheral area NDA. The pads PD may be disposed closer to a lower end of the display panel DP than the data driver DDV. The pads PD may be arranged in the first direction DR1. The display device DD (refer to FIG. 1A) may include a circuit board including a timing controller that controls operations of the scan driver SDV, the data driver DDV, and the emission driver EDV and a voltage generation unit that generates a voltage, and the pads PD may be portions to which the circuit board of the display device DD (refer to FIG. 1A) is connected.

The pads PD may be connected to a corresponding signal line among the plurality of signal lines. The first and second power lines PL1 and PL2 and the first and second control lines CSL1 and CSL2 may be connected to the pads PD. The data lines DL1 to DLn may be connected to the corresponding pads PD through the data driver DDV. In an embodiment, the data lines DL1 to DLn may be connected to the data driver DDV, and the data driver DDV may be connected to the pads PD respectively corresponding to the data lines DL1 to DLn, for example.

The scan driver SDV may generate scan signals in response to a scan control signal. The scan signals may be applied to the pixels PX through the scan lines SL1 to SLm. The data driver DDV may generate data voltages corresponding to image signals in response to a data control signal. The data voltages may be applied to the pixels PX through the data lines DL1 to DLn. The emission driver EDV may generate light emission signals in response to a light emission control signal. The light emission signals may be applied to the pixels PX through the emission lines EL1 to ELm.

The pixels PX may receive the data voltages in response to the scan signals. The pixels PX may display an image by emitting light beams having luminances corresponding to the data voltages in response to the light emission signals. Light emission times of the pixels PX may be controlled by the light emission signals. The display panel DP may output the image through the display area DA by the pixels PX.

Figure 4A:
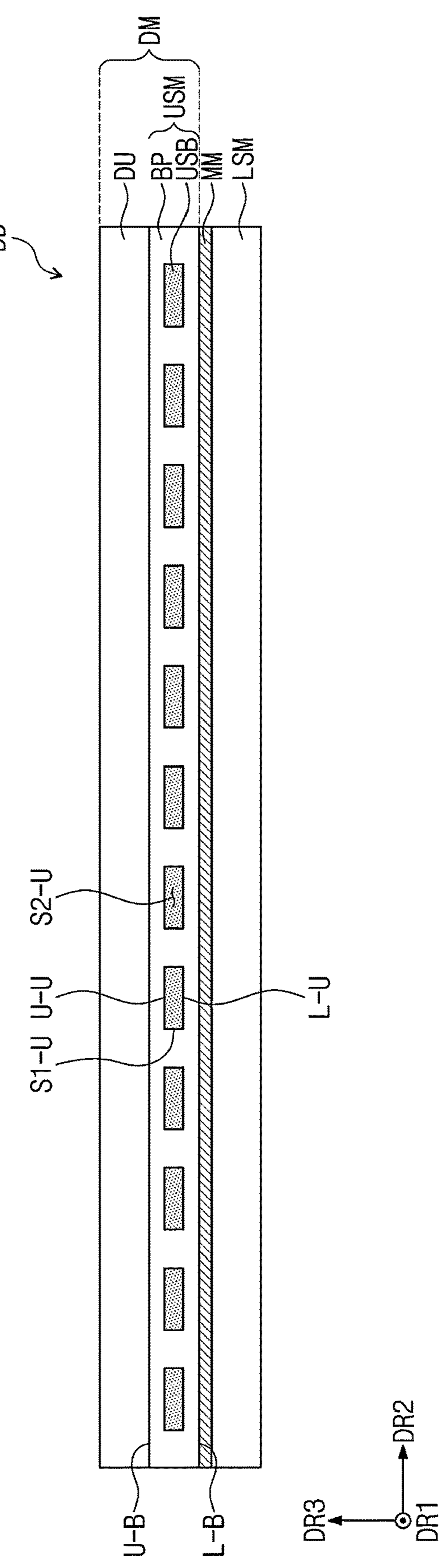
FIGS. 4A and 4B are cross-sectional views of an embodiment of the display device according to the disclosure.
Figure 4B:
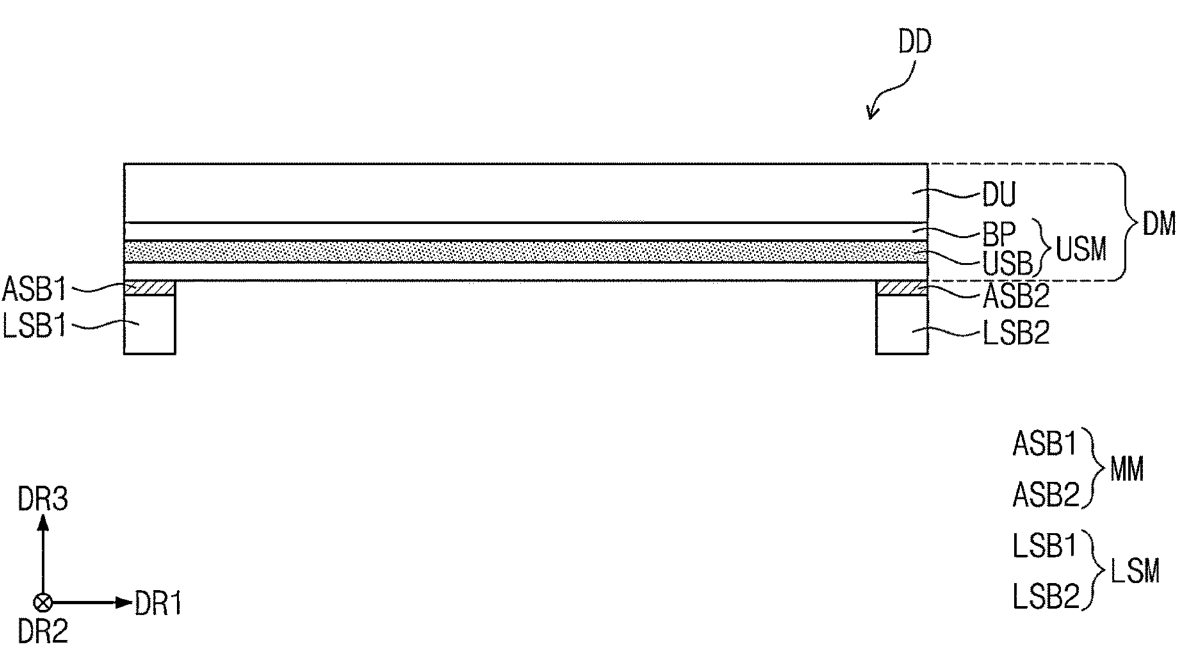

FIGS. 4A and 4B are cross-sectional views of an embodiment of the display device DD according to the disclosure. FIG. 4A illustrates a cross section in a direction in which the long side of the display device DD extends, and FIG. 4B illustrates a cross section in a direction in which the short side of the display device DD extends.

Referring to FIGS. 4A and 4B, the display device DD in an embodiment of the disclosure may include the display unit DU, the upper support member USM, the intermediate member MM, and the lower support member LSM. The description of the display unit DU has been described above with reference to FIG. 2B and thus will be omitted.

The upper support member USM may include upper support bars USB and a base part BP.

Each of the upper support bars USB may extend in the first direction DR1 parallel to the rolling axis RX (refer to FIG. 1B). The upper support bars USB may be arranged in the second direction DR2 intersecting a direction in which the upper support bars USB extend. The upper support bars USB may be arranged at equal intervals in the second direction DR2. However, the disclosure is not limited thereto, and an interval between the upper support bars USB may gradually increase or decrease in the second direction DR2.

Each of the upper support bars USB may have a rod shape extending in the first direction DR1. In an embodiment, as illustrated in FIG. 4B, each of the upper support bars USB may have a quadrangular shape, e.g., rectangular shape in a cross-section viewed in the second direction DR2. However, the shape of each of the upper support bars USB in a cross-section is not limited thereto and may be a polygonal shape or circular shape.

The upper support bars USB may have a predetermined rigidity. In an embodiment, the upper support bars USB may include at least one of a metal, a plastic, a carbon fiber, and a glass fiber, for example. The upper support bars USB may include aluminum, stainless steel, invar, a carbon fiber reinforced plastic ("CFRP"), a glass fiber reinforced plastic ("GFRP"), or the like. Further, in an embodiment, the upper support bars USB may include a metal attached to a magnet.

A modulus value (or modulus) of each of the upper support bars USB may be greater than a modulus value of the base part BP. The upper support bars USB having a relatively large modulus may support the display unit DU and improve impact resistance of the upper support member USM.

The base part BP may be coupled to the upper support bars USB. The base part BP may contact the upper support bars USB. The base part BP may cover at least a portion of each of the upper support bars USB. At least a portion of the base part BP may be disposed on the upper support bars USB and cover upper surfaces U-U of the upper support bars USB.

In an embodiment, the base part BP may cover all surfaces of the upper support bars USB extending in the first direction DR1. In detail, the base part BP may cover all the upper surface U-U, side surfaces S1-U extending in the first direction DR1, and a lower surface L-U of each of the upper support bars USB. The base part BP may be filled between the upper support bars USB spaced apart from each other in the second direction DR2. Thus, the upper support bars USB in an embodiment may be disposed inside the base part BP.

In an embodiment, the base part BP may expose opposite ends of each of the upper support bars USB. That is, side surfaces S2-U of each of the upper support bars USB, which face each other in the first direction DR1, may be exposed. However, the disclosure is not limited thereto, and the base part BP may cover opposite ends of each of the upper support bars USB. In this case, the base part BP may cover a whole surface of each of the upper support bars USB.

In an embodiment, an edge of the base part BP may be aligned with an edge of the display unit DU. That is, a width of the base part BP in the first direction DR1 and a width of the base part BP in the second direction DR2 may be substantially the same as a width of the display unit DU in the first direction DR1 and a width of the display unit DU in the second direction DR2.

The base part BP may include an upper surface U-B parallel to the first direction DR1 and the second direction DR2 and a lower surface L-B facing the upper surface U-B. An interval between the upper surface U-B and the lower surface L-B of the base part BP may be substantially uniform. Accordingly, a thickness of the base part BP may be uniform within an area in which the display unit DU is disposed.

Since the display unit DU is disposed on the upper surface U-B of the base part BP having a flat surface, a portion of the display unit DU, which overlaps a space between the upper support bars USB, is not deformed and is maintained in a flat state. That is, the surface quality of the display unit DU may be improved by the base part BP.

The base part BP may include an elastomer having a predetermined elastic force. In an embodiment, the elastomer may include at least one of thermoplastic polyurethane, silicone, thermoplastic rubber, elastolefin, thermoplastic olefin, polydimethylsiloxane, polyurethane acrylate, polyamide, polyether block amide, synthetic polyisoprene, polybutadiene, chloroprene rubber, butyl rubber, styrene-butadiene, epichlorohydrin rubber, polyacrylic rubber, silicone rubber, fluorosilicone rubber, fluoroelastomer, and ethylene-vinyl acetate, for example.

The lower support member LSM may be disposed below the upper support member USM. The lower support member LSM may include two support bars (hereinafter, also referred to as a first lower support bar LSB1 and a second lower support bar LSB2). The first lower support bar LSB1 and the second lower support bar LSB2 may extend in the second direction DR2 and may be spaced apart from each other in the first direction DR1.

The first lower support bar LSB1 may be adjacent to one side of the display module DM extending in the second direction DR2, and the second lower support bar LSB2 may be adjacent to the other side of the display module DM extending in the second direction DR2. In a cross-section of the display device DD obtained by cutting one upper support bar USB in the first direction DR1, the first lower support bar LSB1 may be adjacent to one end of the one upper support bar USB, and the second lower support bar LSB2 may be adjacent to the other end of the one upper support bar USB.

In an embodiment, the first lower support bar LSB1 may overlap at least a portion of one side of the display module DM extending in the second direction DR2, and the second lower support bar LSB2 may overlap at least a portion of the other side of the display module DM extending in the second direction DR2. The first lower support bar LSB1 may overlap at least some of ends of the upper support bars USB, and the second lower support bar LSB2 may overlap at least some of the other ends of the upper support bars USB. The first lower support bar LSB1 may be substantially aligned with one end of the base part BP, through which the ends of the upper support bars USB are exposed, and the second lower support bar LSB2 may be substantially aligned with the other end of the base part BP, through which the other ends of the upper support bars USB are exposed.

Each of the first and second lower support bars LSB1 and LSB2 may have a predetermined rigidity. In an embodiment, each of the first and second lower support bars LSB1 and LSB2 may include at least one of a metal, a plastic, a carbon fiber, and a glass fiber, for example. Each of the first and second lower support bars LSB1 and LSB2 may include aluminum, stainless steel, invar, a CFRP, a GFRP, or the like. However, the materials of the first and second lower support bars LSB1 and LSB2 are not limited thereto and may include various materials as long as the first and second lower support bars LSB1 and LSB2 may support the display module DM.

The intermediate member MM may be disposed between the upper support member USM and the lower support member LSM. The intermediate member MM may include a first impact absorbing member ASB1 disposed between the upper support member USM and the first lower support bar LSB1 and a second impact absorbing member ASB2 disposed between the upper support member USM and the second lower support bar LSB2.

In an embodiment, the entirety of the first impact absorbing member ASB1 may overlap the first lower support bar LSB1, and the entirety of the second impact absorbing member ASB2 may overlap the second lower support bar LSB2. In an embodiment, a width of the first impact absorbing member ASB1 in the first direction DR1 may be substantially equal to or smaller than a width of the first lower support bar LSB1 in the first direction DR1, and a width of the second impact absorbing member ASB2 in the first direction DR1 may be substantially equal to or smaller than a width of the second lower support bar LSB2 in the first direction DR1, for example. However, the disclosure is not limited thereto, and the width of the first impact absorbing member ASB1 in the first direction DR1 may be greater than the width of the first lower support bar LSB1 in the first direction DR1, and the width of the second impact absorbing member ASB2 in the first direction DR1 may be greater than the width of the second lower support bar LSB2 in the first direction DR1.

The first impact absorbing member ASB1 and the second impact absorbing member ASB2 may respectively have modulus values (or moduli) smaller than those of the first lower support bar LSB1 and the second lower support bar LSB2. Further, the first impact absorbing member ASB1 and the second impact absorbing member ASB2 may have modulus values smaller than that of the upper support member USM (specifically, the base part BP). In an embodiment, each of the first and second impact absorbing members ASB1 and ASB2 may include a porous material such as sponge and foam. In an embodiment, the sponge may include polyeter, polyvinyl alcohol, and polyester, and the foam may include polyurethane, for example. In an alternative embodiment, each of the first and second impact absorbing members ASB1 and ASB2 may include rubber.

In an embodiment, a thickness of each of the first and second impact absorbing members ASB1 and ASB2 may be 1 millimeter (mm) or less. When the thickness of each of the first and second impact absorbing members ASB1 and ASB2 exceeds 1 mm, deformation such as bending may easily occur in the display module DM due to a predetermined external pressure. However, the thickness of each of the first and second impact absorbing members ASB1 and ASB2 is not limited thereto, and a suitable thickness may change depending on the materials and/or the thicknesses of components inside the upper support member USM.

Figure 5:
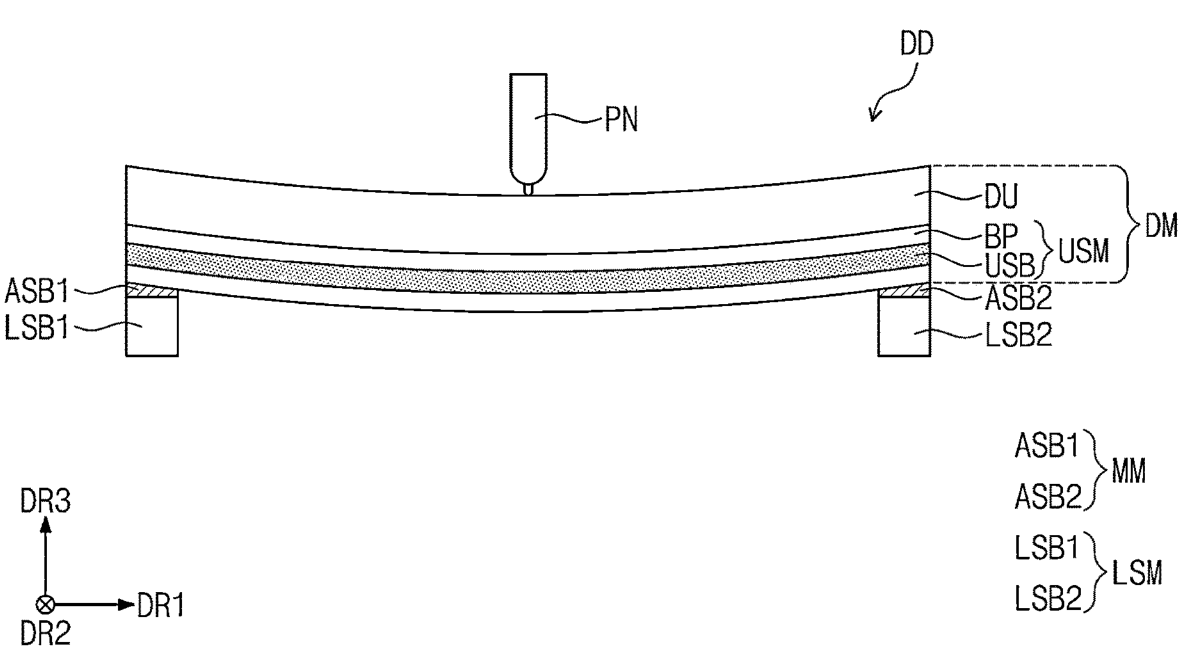
FIG. 5 is a cross-sectional view of an embodiment of a pen-dropped display device according to the disclosure.

FIG. 5 is a cross-sectional view of an embodiment of a pen-dropped display device DD according to the disclosure. FIG. 5 illustrates a cross section in a direction in which the short side of the display device DD extends. FIG. 5 illustrates a cross section at a time point when an external impact is applied to an upper portion of the display device DD and illustratively illustrates that an external impact is applied by a pen drop. The same or similar reference numerals are used for the same or similar components described in FIGS. TA to 4B, and a duplicated description thereof will be omitted.

Referring to FIG. 5, when an external impact is applied to a local area of the display device DD by the pen drop, the first lower support bar LSB1 and the second lower support bar LSB2 support the display module DM, and thus the upper support bar USB to which an external impact is applied may be bent in a direction in which a pen PN is dropped. In this case, a curvature may be formed in the entirety of the upper support bar USB to which an external impact is applied.

The base part BP and the display unit DU may also be bent in a vicinity to which an external impact is applied together with the upper support bar USB in the direction in which the pen PN is dropped, and therefore, a curvature may be formed in the entirety of the base part BP and the entirety of the display unit DU. Thus, an impulse applied to the local area by an external impact may be transmitted to a more expanded area, thereby improving impact resistance of the display device DD.

When an external impact is applied to a vicinity of a center of the display module DM, as the upper support bar USB is sufficiently bent, the impulse applied to the vicinity of the center may be transmitted to the more expanded area and thus sufficiently absorbed, and thus an impulsive force applied to the display device DD may be reduced.

When an external impact is applied to a vicinity of an edge of the display module DM adjacent to the first lower support bar LSB1 or the second lower support bar LSB2, even when the upper support bar USB is supported by the first lower support bar LSB1 or the second lower support bar LSB2, an external impact may be absorbed through the first impact absorbing member ASB1 or the second impact absorbing member ASB2, and thus the impulsive force applied to the display device DD may be reduced. In more detail, the thickness of the first impact absorbing member ASB1 or the second impact absorbing member ASB2 may be reduced as the first impact absorbing member ASB1 or the second impact absorbing member ASB2 is pressed in the vicinity in which an external impact is applied, and therefore, the upper support bar USB may be bent in the direction in which the pen PN is dropped.

Thus, the lower support member LSM and the intermediate member MM according to the disclosure may absorb an external impact regardless of a point at which an external impact is applied, and thus impact resistance in the entirety of the area of the display module DM may be improved. Damage to the display unit DU from an external impact may be prevented, and thus a bright spot or a dark spot may be prevented from occurring on the display surface DS (refer to FIG. 1A). Accordingly, the display device DD having improved reliability may be provided.

Figure 6A:
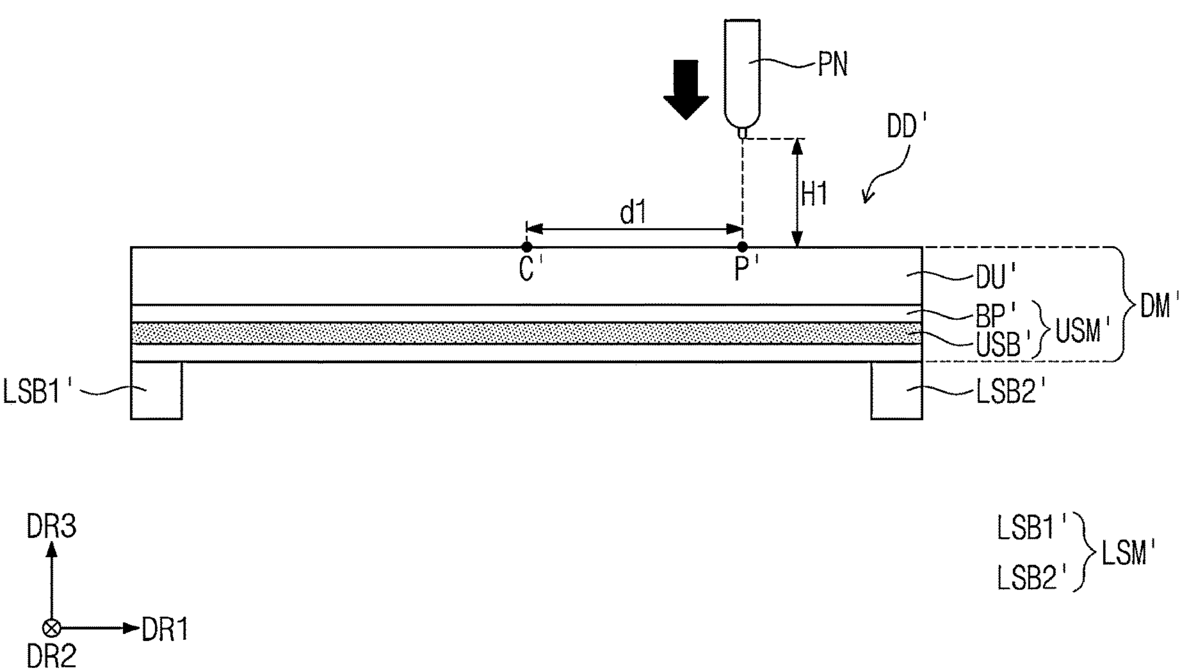
FIG. 6A is a cross-sectional view of an embodiment of the display device according to the disclosure in which a pen drop test is performed.
Figure 6B:
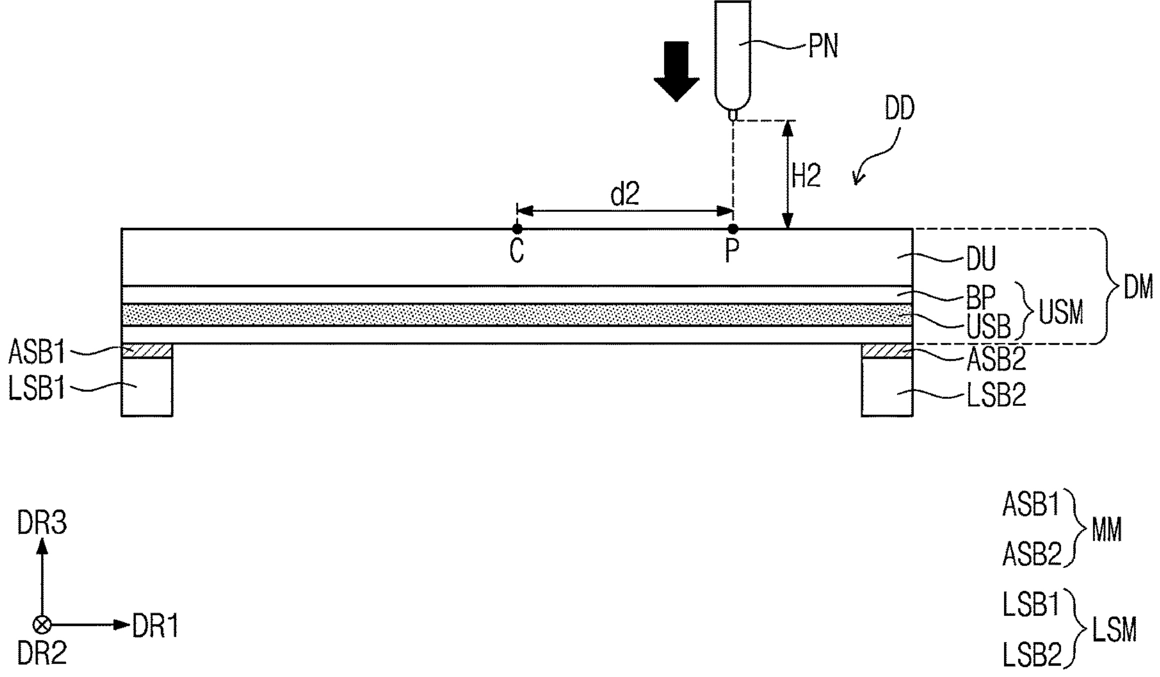
FIG. 6B is a cross-sectional view of a comparative example of the display device in which the pen drop test is performed.
Figure 7A:
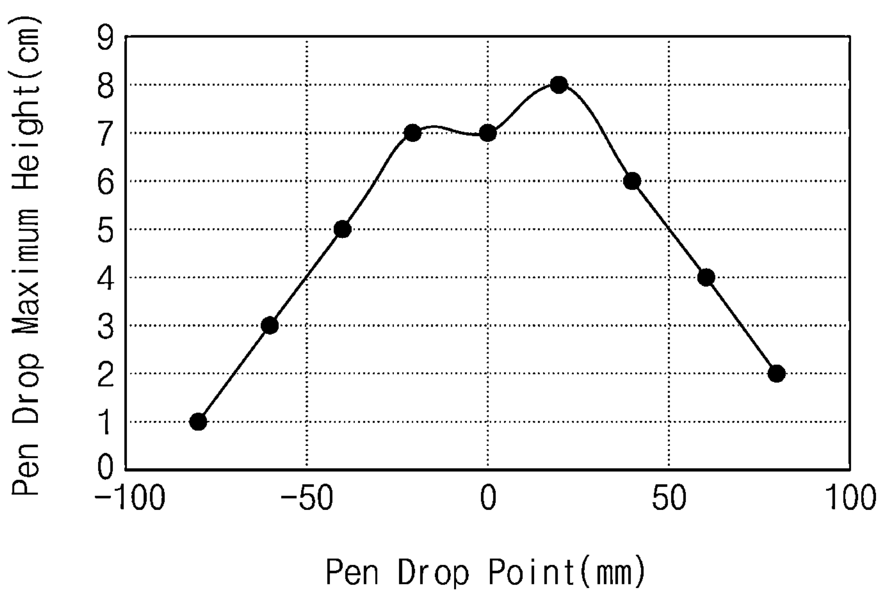
FIG. 7A is a graph illustrating an embodiment of a relationship between a pen drop point and a pen drop maximum height in the display device according to the disclosure.
Figure 7B:
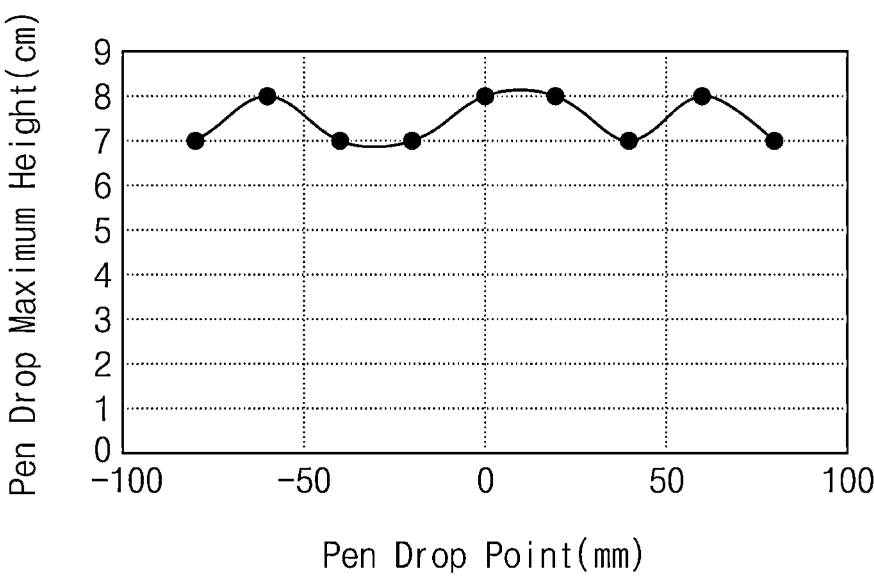
FIG. 7B is a graph illustrating a relationship between a pen drop point and a pen drop maximum height in the comparative example of the display device.

FIG. 6A is a cross-sectional view of a comparative example of a display device in which a pen drop test is performed. FIG. 6B is a cross-sectional view of an embodiment of the display device according to the disclosure in which the pen drop test is performed. FIG. 7A is a graph illustrating a relationship between a pen drop point and a pen drop maximum height in the comparative example of the display device. FIG. 7B is a graph illustrating a relationship between a pen drop point and a pen drop maximum height in an embodiment of the display device according to the disclosure. Hereinafter, referring to FIGS. 6A to 7B, impact resistance against pen drop in the comparative example of a display device DD' and an embodiment of the display device DD according to the disclosure will be described.

As illustrated in FIG. 6A, the comparative example of the display device DD' in which the pen drop test is performed includes a display unit DU', an upper support member USM', and a lower support member LSM'. The upper support member USM' includes a base part BP' and upper support bars USB' arranged thereinside, and the lower support member LSM' includes a first lower support bar LSB1' and a second lower support bar LSB2'. In the comparative example, each of the first and second lower support bars LSB1' and LSB2' contacts the upper support member USM'.

As illustrated in FIG. 6B, the display device DD in an embodiment of the disclosure in which the pen drop test is performed includes the display unit DU, the upper support member USM, the intermediate member MM, and the lower support member LSM. The upper support member USM includes the base part BP and the upper support bars USB arranged thereinside, the lower support member LSM includes the first lower support bar LSB1 and the second lower support bar LSB2, and the intermediate member MM includes the first impact absorbing member ASB1 disposed between the upper support member USM and the first lower support bar LSB1 and the second impact absorbing member ASB2 disposed between the upper support member USM and the second lower support bar LSB2. In the test, each of the first and second impact absorbing members ASB1 and ASB2 was including a sponge having a thickness of about 1 mm.

As illustrated in FIGS. 6A and 6B, the pen drop test was performed in a manner in which the pen PN is dropped onto the display devices DD' and DD to be tested. In detail, the pen drop test was performed while varying pen drop heights H1 and H2 for each preset pen drop point, and a pen drop maximum height at which a dark spot does not occur on the display panel DP (refer to FIG. 3) was measured. In this case, the pen drop point refers to a distance away from the center of the display modules DM' and DM, distances d1 and d2 between points P' and P spaced apart from centers C' and C of the display modules DM' and DM in the first direction DR1 were written as positive values, and the distances d1 and d2 between the points P' and P spaced apart from the centers C' and C of the display modules DM' and DM in a direction opposite to the first direction DR1 were written as negative values. In the test, a width of each of the display modules DM' and DM in the first direction DR1 was set to 200 mm, and the pen drop point was set to −80 mm, −60 mm, −40 mm, −20 mm, 0 mm, 20 mm, 40 mm, 60 mm, and 80 mm.

Further, in the test, the test was performed in cases in which the pen drop heights H1 and H2 were increased by 1 centimeter (cm) each time, starting from 1 cm, and a pen drop height at which the dark spot firstly occurs was measured at each preset pen drop point. The pen drop maximum height illustrated in FIGS. 7A and 7B refers to a maximum value of the pen drop height at which the dark spot does not occur on the display panel DP (refer to FIG. 3), and this corresponds to a value obtained by subtracting 1 cm from the pen drop height at which the dark spot occurs.

As illustrated in FIG. 7A, according to a comparative example, when the pen drop is performed at a point P' of −20 mm to 20 mm, it may be identified that the pen drop maximum height at which the dark spot does not occur on the display panel DP (refer to FIG. 3) may be 7 cm to 8 cm. According to a comparative embodiment, when the pen drop is performed at the point P' of more than 20 mm and less than −20 mm, it may be identified that the pen drop maximum height at which the dark spot does not occur on the display panel DP (refer to FIG. 3) is reduced as the pen drop point is further away from the center C' of the display module DM'. When the point P' at which the pen drop is performed is disposed in a vicinity of an edge of the display module DM' adjacent to the first lower support bar LSB1' or the second lower support bar LSB2', it may be identified that the pen drop maximum height at which the dark spot does not occur on the display panel DP (refer to FIG. 3) decreases to a level of 1 cm to 2 cm.

As illustrated in FIG. 7B, according to the disclosure, it may be identified that the pen drop maximum height at which the dark spot does not occur on the display panel DP (refer to FIG. 3) at the point P at which the pen drop is performed may be 7 cm to 8 cm. Therefore, even when the pen drop point becomes farther from the center C of the display module DM and becomes adjacent to the first lower support bar LSB1 or the second lower support bar LSB2, it may be identified that the pen drop maximum height at which the dark spot does not occur on the display panel DP (refer to FIG. 3) is similar to that of a case in which the pen drop point is disposed in the vicinity of the center of the display module DM.

Thus, in an embodiment, when an external impact is applied to the vicinity of the edge of the display module DM adjacent to the first lower support bar LSB1 or the second lower support bar LSB2, it may be identified that the external impact may be absorbed through the first impact absorbing member ASB1 or the second impact absorbing member ASB2, and therefore, the display module DM may be prevented from being damaged. Thus, it may be identified that impact resistance is improved in the entirety of the area of the display module DM.

Figure 8A:
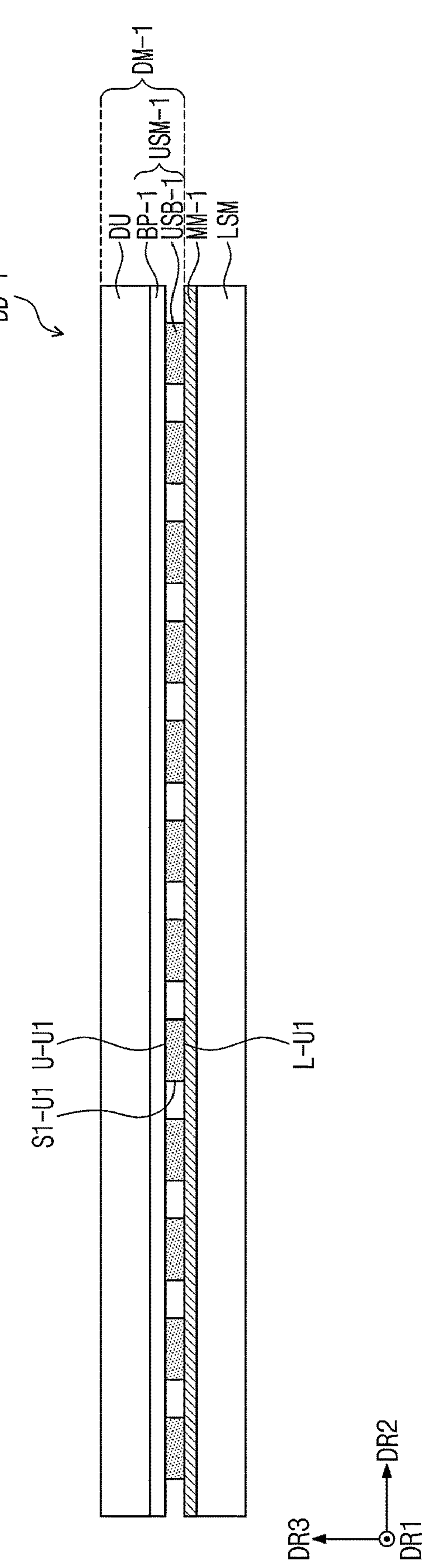
FIGS. 8A and 8B are cross-sectional views of an embodiment of the display device according to the disclosure.
Figure 8B:
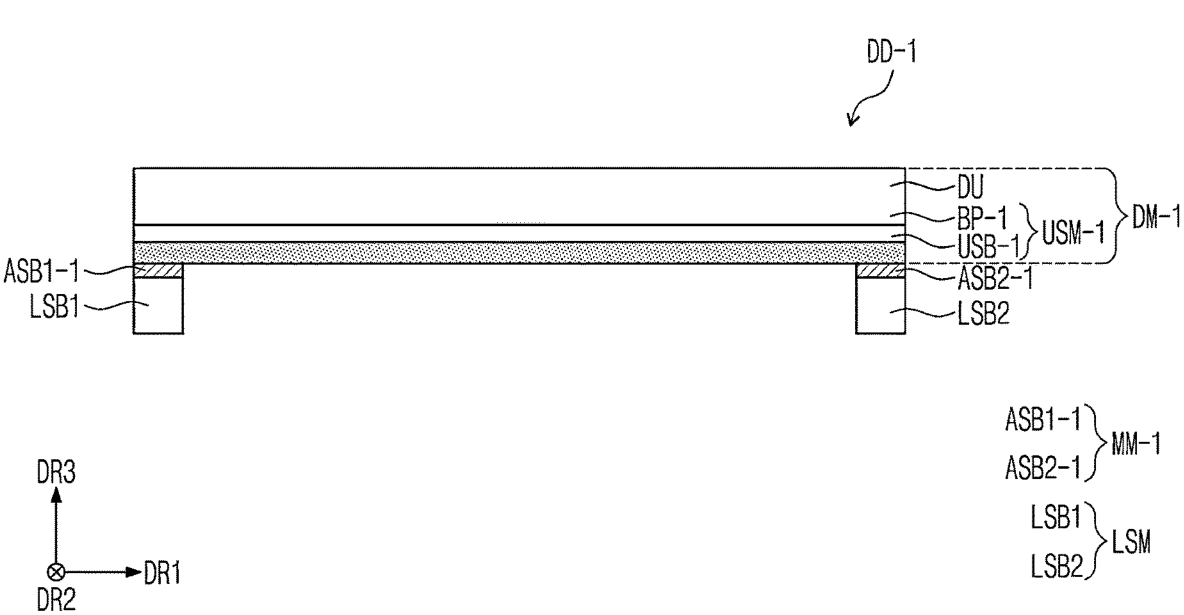

FIGS. 8A and 8B are cross-sectional views of an embodiment of a display device DD-1 according to the disclosure. Referring to FIGS. 8A and 8B, the display device DD-1 in an embodiment of the disclosure may include the display unit DU, an upper support member USM-1, an intermediate member MM-1, and the lower support member LSM. The same or similar reference numerals are used for the same or similar components described in FIGS. 1A to 5, a duplicated description thereof will be omitted, and a difference will be mainly described.

The upper support member USM-1 may include a base part BP-1 and upper support bars USB-1. In an embodiment, the base part BP-1 may be attached to a lower portion of the display unit DU, and the upper support bars USB-1 may be attached to a lower portion of the base part BP-1. In detail, an upper surface U-U1 of each of the upper support bars USB-1 may be attached to the base part BP-1. In this case, side surfaces S1-U1 of each of the upper support bars USB-1 extending in the in the first direction DR1 may be exposed.

The lower support member LSM may include the first lower support bar LSB1 and the second lower support bar LSB2, and the intermediate member MM-1 may include a first impact absorbing member ASB1-1 disposed between the upper support bars USB-1 and the first lower support bar LSB1 and a second impact absorbing member ASB2-1 disposed between the upper support bars USB-1 and the second lower support bar LSB2.

In an embodiment, each of the first and second impact absorbing members ASB1-1 and ASB2-1 may contact at least some of the upper support bars USB-1. In detail, each of the first and second impact absorbing members ASB1-1 and ASB2-1 may contact lower surfaces L-U1 of at least some of the upper support bars USB-1. The first and second impact absorbing members ASB1-1 and ASB2-1 may be provided in contact with end portions and the other end portions of the upper support bars USB-1, and the first and second impact absorbing members ASB1-1 and ASB2-1 may be provided in contact with the first and second lower support bars LSB1 and LSB2.

Figure 9A:
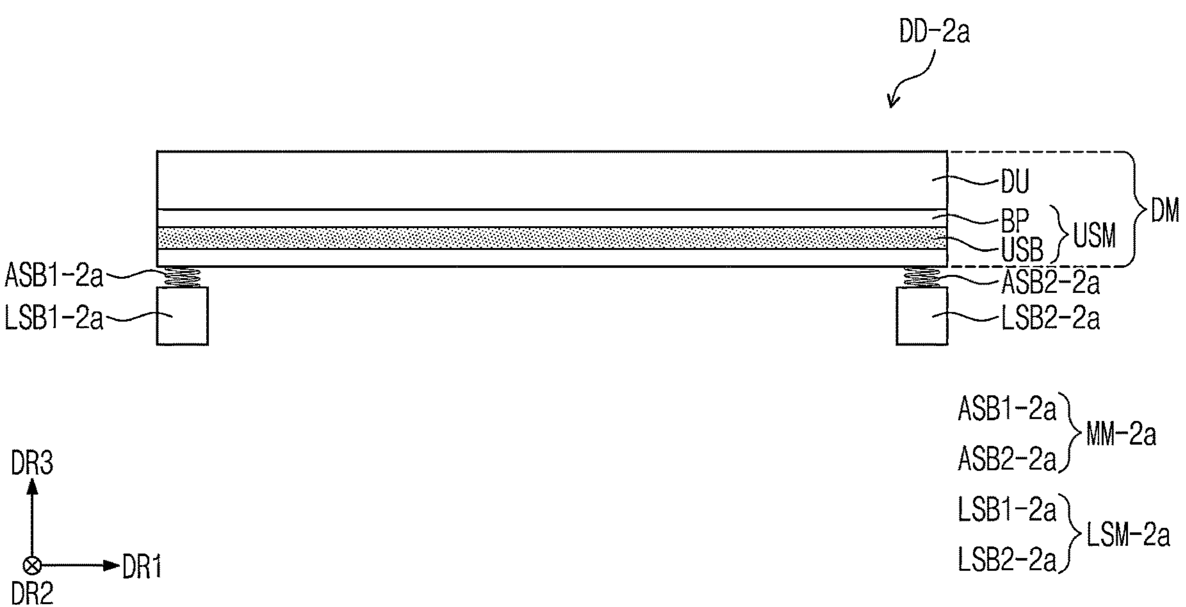
FIGS. 9A and 9B are cross-sectional views of an embodiment of the display device according to the disclosure.
Figure 9B:
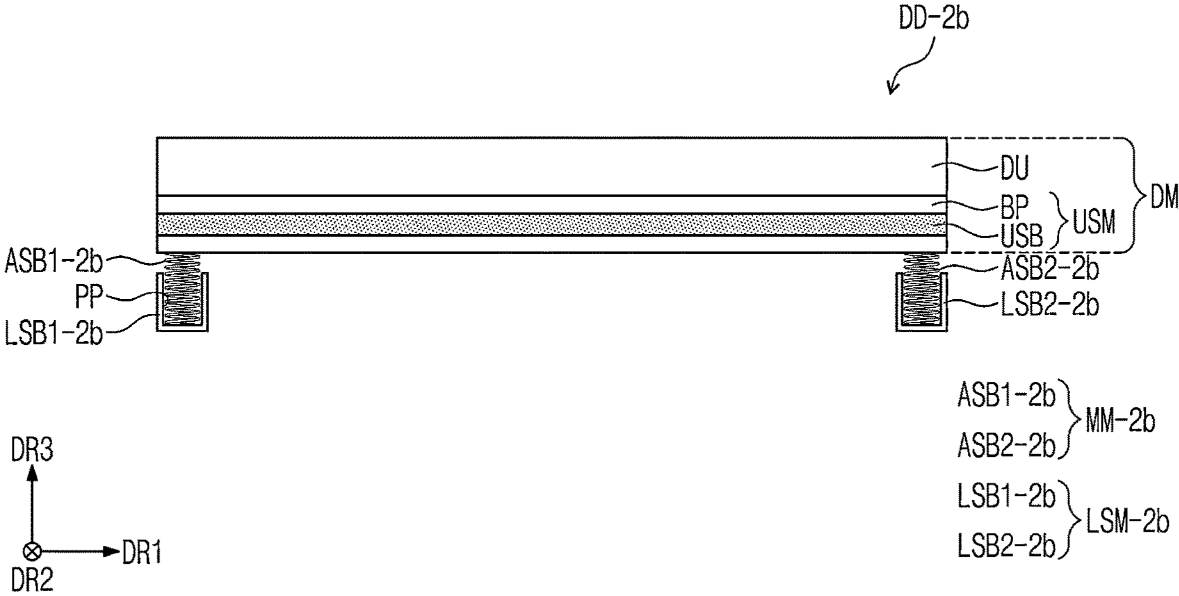

FIGS. 9A and 9B are cross-sectional views of an embodiment of display devices DD-2*a* and DD-2*b* according to the disclosure. Referring to FIGS. 9A and 9B, the display devices DD-2*a* and DD-2*b* in an embodiment of the disclosure may include the display unit DU, the upper support member USM, intermediate members MM-2*a* and MM-2*b*, and lower support members LSM-2*a* and LSM-2*b*. The same or similar reference numerals are used for the same or similar components described in FIGS. 1A to 5, a duplicated description thereof will be omitted, and a difference will be mainly described.

The lower support members LSM-2*a* and LSM-2*b* may include first lower support bars LSB1-2*a* and LSB1-2*b* and second lower support bars LSB2-2*a* and LSB2-2*b*, and the intermediate members MM-2*a* and MM-2*b* may include first impact absorbing members ASB1-2*a* and ASB1-2*b* arranged between the upper support bars USB and the first lower support bars LSB1-2*a* and LSB1-2*b* and second impact absorbing members ASB2-2*a* and ASB2-2*b* arranged between the upper support bars USB and the second lower support bars LSB2-2*a* and LSB2-2*b*.

In an embodiment, each of the first impact absorbing members ASB1-2*a* and ASB1-2*b* and the second impact absorbing members ASB2-2*a* and ASB2-2*b* may be a spring.

As illustrated in FIG. 9A, each of the first lower support bar LSB1-2*a* and the second lower support bar LSB2-2*a* may be provided in a quadrangular shape, e.g., rectangular bar shape. The first impact absorbing member ASB1-2*a* and the second impact absorbing member ASB2-2*a* may be arranged on the first lower support bar LSB1-2*a* and the second lower support bar LSB2-2*a*, respectively.

In an alternative embodiment, as illustrated in FIG. 9B, the first lower support bar LSB1-2*b* and the second lower support bar LSB2-2*b* may provide an inner space PP in which the first impact absorbing member ASB1-2*b* and the second impact absorbing member ASB2-2*b* may be arranged. A portion of the first impact absorbing member ASB1-2*b* may be disposed inside the inner space PP of the first lower support bar LSB1-2*b*, and a portion of the second impact absorbing member ASB2-2*b* may be disposed inside the inner space PP of the second lower support bar LSB2-2*b*.

Figure 10A:
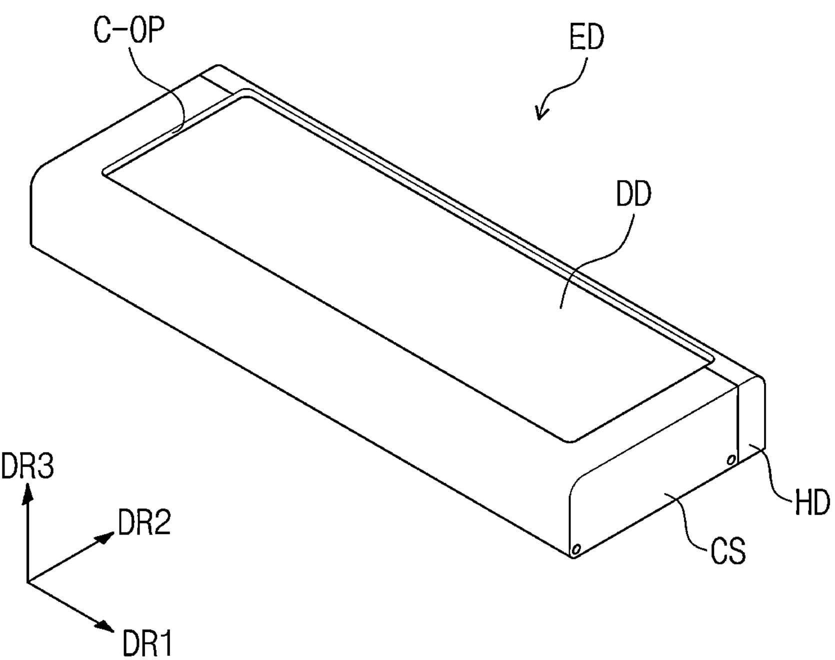
Figure 10B:
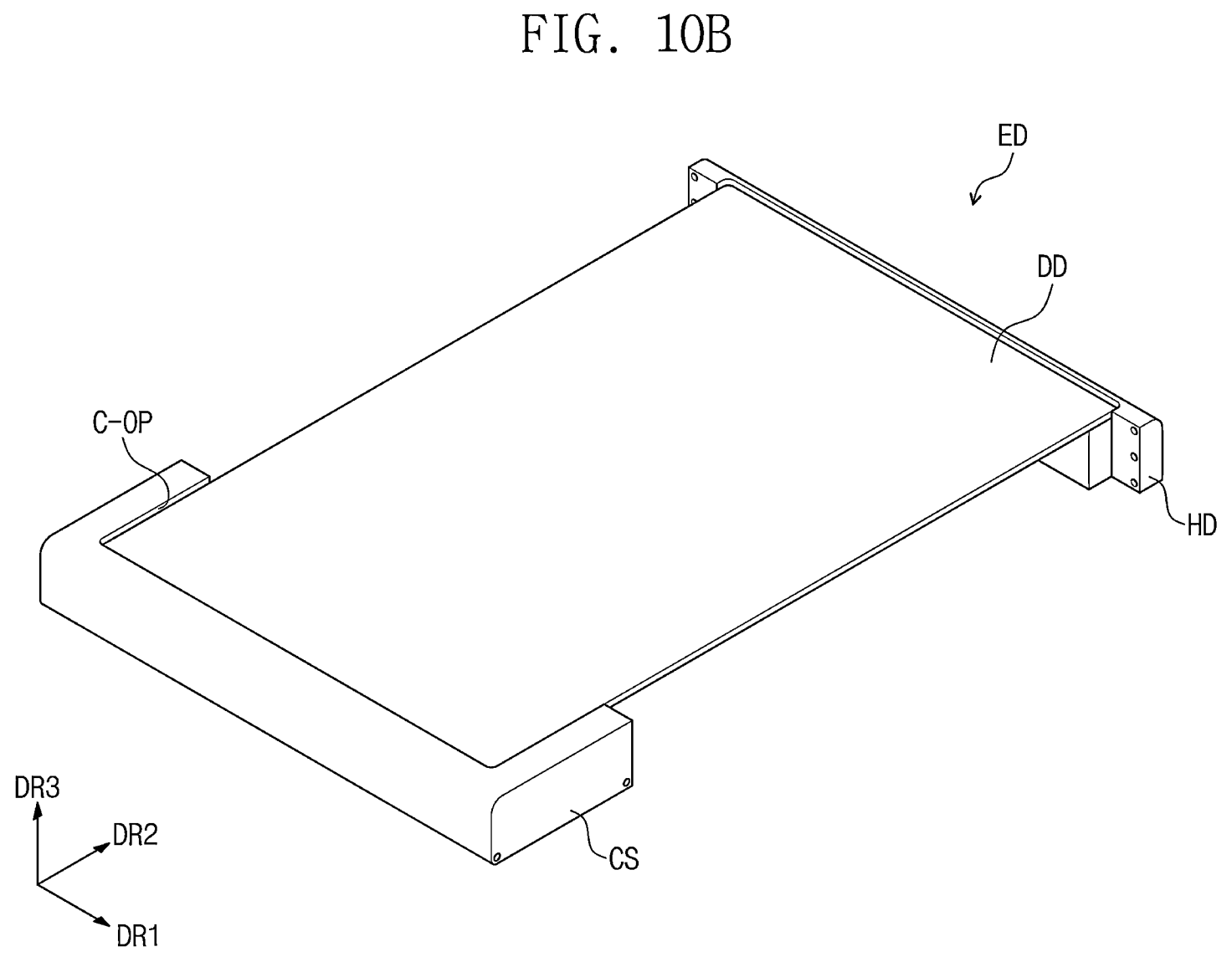
Figure 11:
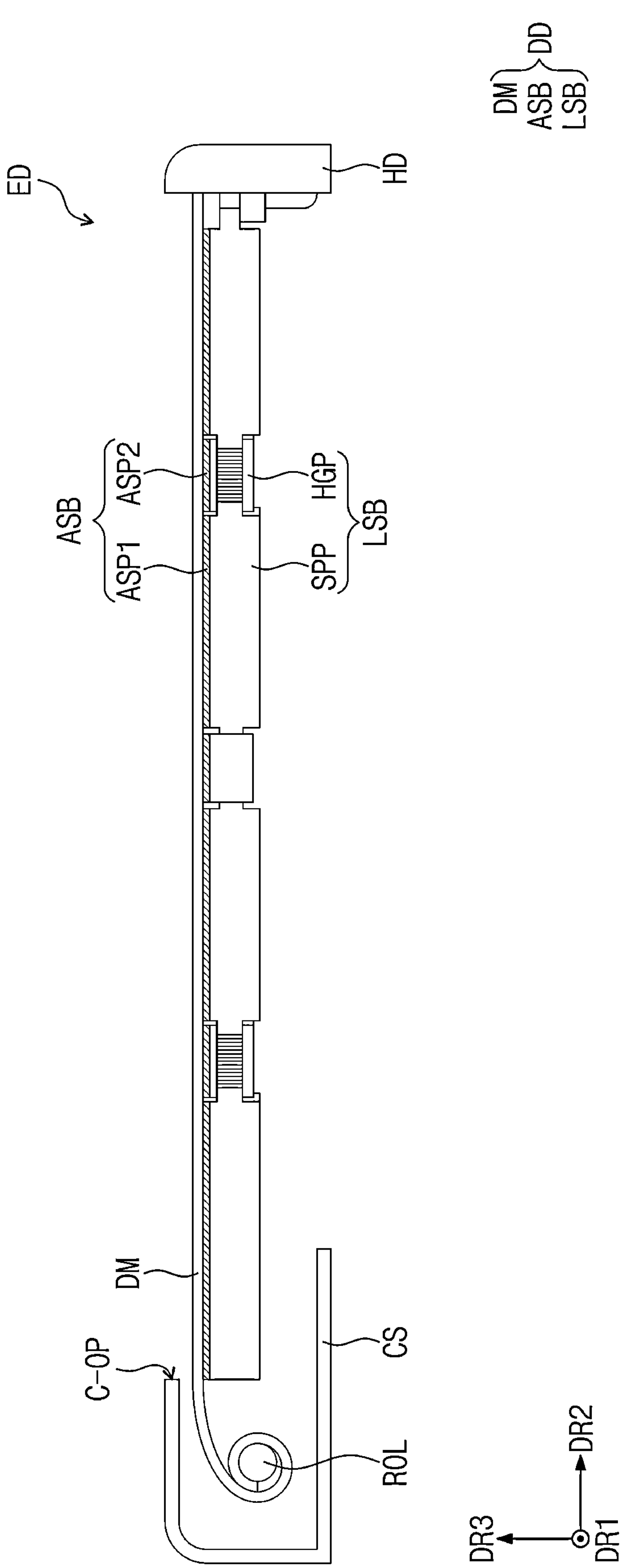
FIG. 11 is a cross-sectional view of an embodiment of the electronic device according to the disclosure.

FIGS. 10A and 10B are perspective views of an embodiment of an electronic device ED according to the disclosure. FIG. 11 is a cross-sectional view of an embodiment of the electronic device ED according to the disclosure.

Referring to FIGS. 10A to 11, the electronic device ED in an embodiment of the disclosure may include a case CS, a roller ROL, the display device DD, and a holder HD. The roller ROL and the display device DD may be accommodated inside the case CS. The electronic device ED may further include an additional component.

The case CS may include a lower surface and an upper surface parallel to each of the first direction DR1 and the second direction DR2 and side surfaces that connect the lower surface and the upper surface and form an accommodation space therein. An opening C-OP may be defined in an upper surface of the case CS.

The roller ROL may be adjacent to one surface of the case CS inside the case CS. The one surface of the case CS may be spaced apart from the other surface of the case CS adjacent to the holder HD in the second direction DR2. The roller ROL may have a cylindrical shape extending in the first direction DR1, and the roller ROL may have a circular shape when viewed in the first direction DR1. An extension direction of the roller ROL may correspond to an extension direction of the rolling axis RX (refer to FIG. 1B). The roller ROL may rotate clockwise or counterclockwise. Although not separately illustrated, the electronic device ED may further include a driving part for rotating the roller ROL.

One end of the display module DM may be connected to the roller ROL. The display module DM may be wound around the roller ROL and accommodated inside the case CS. The display module DM may roll by the roller ROL. As the roller ROL rotates in one direction, the display module DM may roll while surrounding the roller ROL.

The other end of the display module DM may be connected to the holder HD. When the holder HD moves away from the case CS in the second direction DR2, the roller ROL may rotate in a direction opposite to the one direction, and at least a portion of the display module DM may be unfolded to the outside of the case CS.

FIG. 10A illustrates the electronic device ED in a state in which the display device DD is accommodated in the case CS and the display module DM is rolled. FIG. 10A illustratively illustrates the electronic device ED in which a portion of the display device DD in the rolling state is exposed from the opening C-OP of the case CS to provide the display surface DS (refer to FIG. 1A), but the disclosure is not limited thereto. In the rolling state, the display device DD may be completely inserted into the case CS.

FIGS. 10B and 11 illustrate the electronic device ED in a state in which the display module DM is unfolded. In the unfolded state, the display device DD exposed from the case CS may provide the expanded display surface DS (refer to FIG. 1A). That is, an area of the display surface DS (refer to FIG. 1A) of the display device DD may be adjusted according to movement of the holder HD.

The display device DD may include the display module DM, the intermediate member MM (refer to FIGS. 4A and 4B), and the lower support member LSM (refer to FIGS. 4A and 4B). The display device DD may include the display unit DU (refer to FIGS. 4A and 4B) and the upper support member USM (refer to FIGS. 4A and 4B). The above description may be equally applied to the display module DM, the intermediate member MM (refer to FIGS. 4A and 4B), and the lower support member LSM (refer to FIGS. 4A and 4B). FIG. 11 illustrates any one impact absorbing member (hereinafter, also referred to as an impact absorbing member ASB) among the first and second impact absorbing members ASB1 and ASB2 (refer to FIGS. 4A and 4B) of the intermediate member MM (refer to FIGS. 4A and 4B) and any one lower support bar (hereinafter, also referred to as a lower support bar LSB) among the first and second lower support bars LSB1 and LSB2 (refer to FIGS. 4A and 4B) of the lower support member LSM (refer to FIGS. 4A and 4B).

In an embodiment, the impact absorbing member ASB may be provided to adhere to the lower support bar LSB. In detail, as the holder HD moves, the lower support bar LSB may be unfolded or folded, and in this case, the impact absorbing member ASB may also be unfolded or folded together with the lower support bar LSB. In this case, the impact absorbing member ASB may not be coupled to the display module DM and thus may not roll together with the display module DM.

In an embodiment, the lower support bar LSB may include support parts SPP and at least one hinge part HGP that connect the support parts SPP. FIG. 11 illustratively illustrates that the lower support bar LSB includes four support parts SPP and three hinge parts HGP. When the holder HD moves in a direction away from the case CS, the support parts SPP in a folded state may be unfolded while spaced apart from each other. In contrast, when the holder HD moves in a direction closer to the case CS, the support parts SPP in an unfolded state may be folded while becoming closer to each other. In an embodiment, one end of each of the support parts SPP may be provided in the form of a semicircular gear, and the adjacent support parts SPP may move while engaged with each other through the gear provided at the one end of each of the support parts SPP, for example. In this case, the hinge parts HGP may connect the ends of the support parts SPP moving while engaged with each other.

In an embodiment, the impact absorbing member ASB may include first absorbing parts ASP1 and second absorbing parts ASP2. The first absorbing parts ASP1 may be attached to the support parts SPP, respectively, and the second absorbing parts ASP2 may be attached to the hinge parts HGP, respectively. The first absorbing parts ASP1 and the second absorbing parts ASP2 may be spaced apart from each other. Accordingly, the impact absorbing member ASB may not disturb operations of the support parts SPP and the hinge parts HGP. In an embodiment of the disclosure, the impact absorbing member ASB may include only the first absorbing parts ASP1 and may not be attached to the hinge parts HGP.

Figure 12:
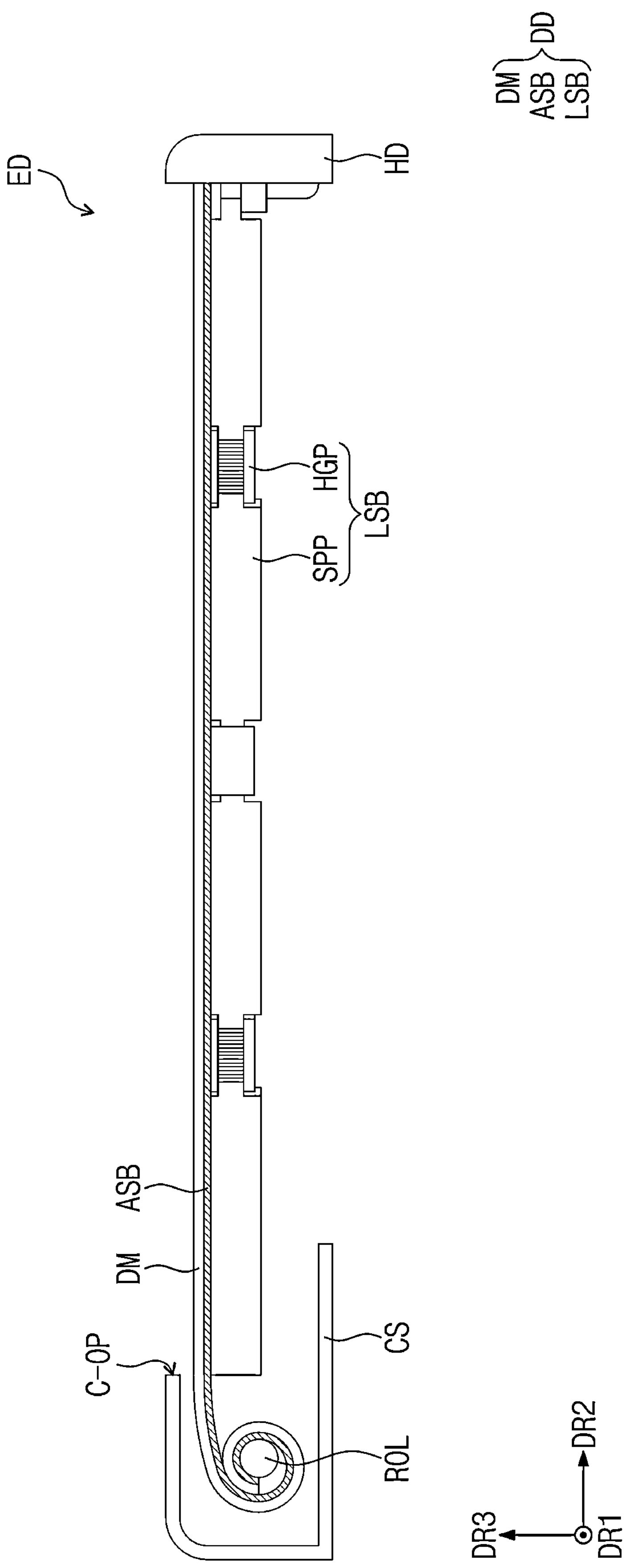
FIG. 12 is a cross-sectional view of an embodiment of the electronic device according to the disclosure.

FIG. 12 is a cross-sectional view of an embodiment of the electronic device ED according to the disclosure. FIG. 12 illustrates the electronic device ED in a state in which the display module DM is unfolded. The same or similar reference numerals are used for the same or similar components described in FIGS. 10A to 11, a duplicated description thereof will be omitted, and a difference will be mainly described.

In an embodiment, the impact absorbing member ASB may be provided to adhere to a lower portion of the display module DM. Accordingly, as the holder HD moves, the display module DM may be unfolded or rolled, and in this case, the impact absorbing member ASB may also be unfolded or rolled together with the display module DM.

In an embodiment, the impact absorbing member ASB may be disposed to continuously extend from one end of the display module DM connected to the holder HD to the other end of the display module DM connected to the roller ROL. However, the disclosure is not limited thereto, and the impact absorbing member ASB may be disposed only in a portion of a rear surface of the display module DM, which overlaps the lower support bar LSB, in a state in which the display module DM is unfolded.

Figure 13A:
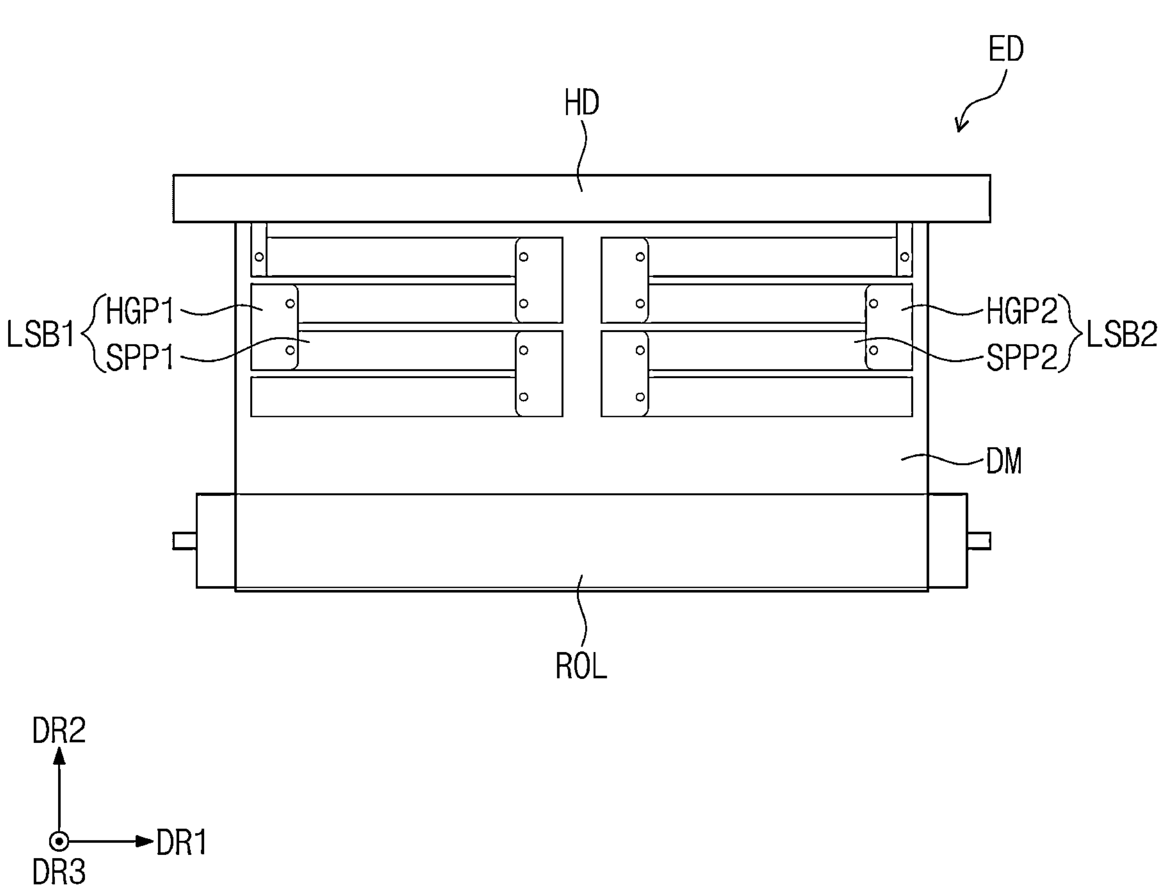
FIGS. 13A and 13B are plan views of an embodiment of partial components of the electronic device according to the disclosure.
Figure 13B:
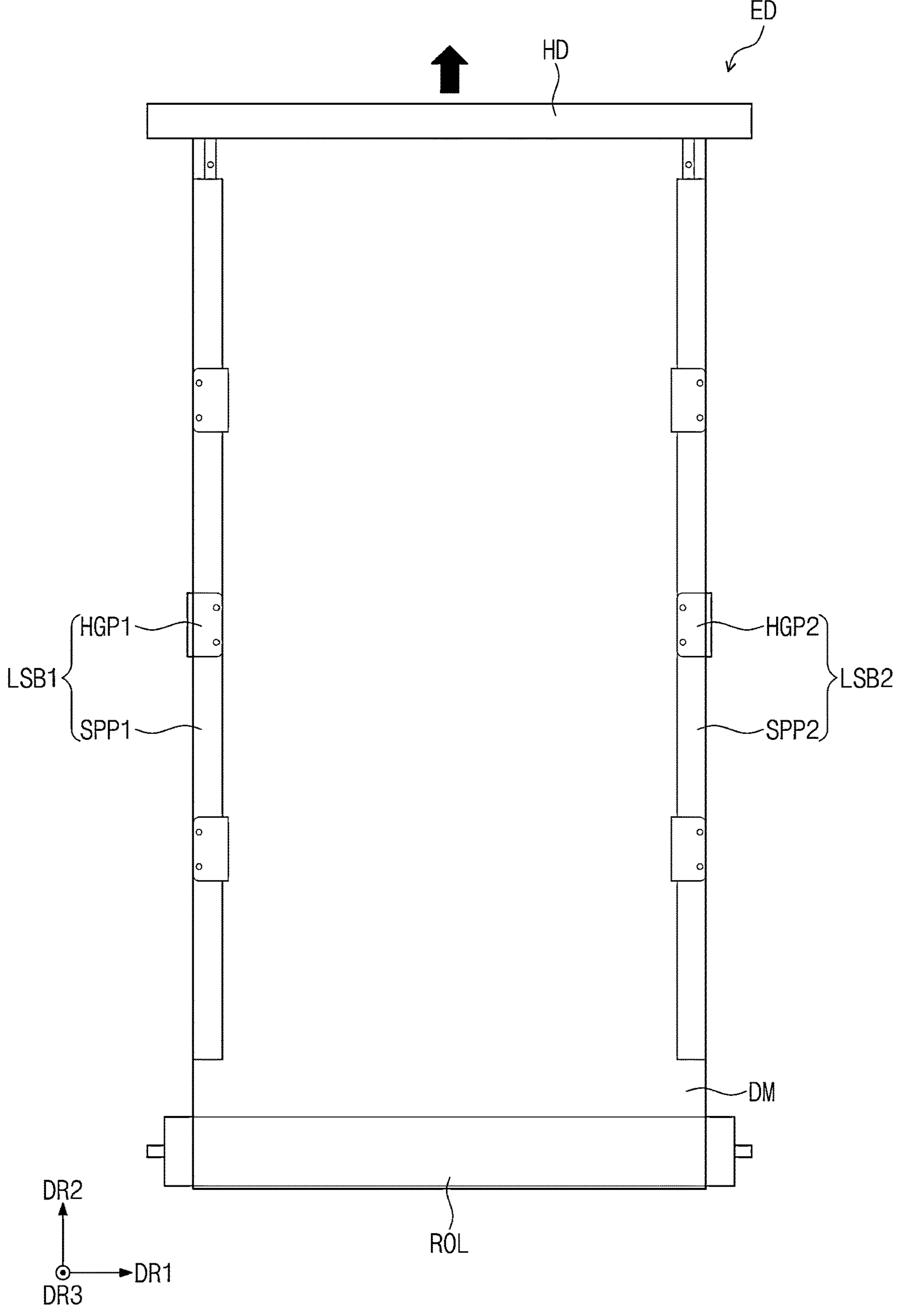

FIGS. 13A and 13B are plan views of an embodiment of partial components of the electronic device ED according to the disclosure. FIGS. 13A and 13B illustrate planar shapes of the lower support bars LSB1 and LSB2 in a state in which the display module DM is rolled and a state in which the display module DM is unfolded, and for convenience of description, illustrate the display module DM, the roller ROL connected to one side of the display module DM extending in the first direction DR1, and the holder HD connected to the other side of the display module DM extending in the first direction DR1 together.

Referring to FIGS. 13A and 13B, the lower support bars LSB1 and LSB2 may include the first lower support bar LSB1 and the second lower support bar LSB2, and the lower support bar LSB described above in FIGS. 11 and 12 may correspond to the first lower support bar LSB1. The first lower support bar LSB1 and the second lower support bar LSB2 may be spaced apart from each other in the first direction DR1, the first lower support bar LSB1 may be disposed closer to one side of the display module DM extending in the second direction DR2, and the second lower support bar LSB2 may be disposed closer to the other side of the display module DM extending in the second direction DR2.

The first lower support bar LSB1 may include first support parts SPP1 and first hinge parts HGP1 that connect the first support parts SPP1. Two adjacent first support parts SPP1 may be connected by one first hinge part HGP1. The two adjacent first support parts SPP1 may be unfolded or folded as the holder HD moves.

As illustrated in FIG. 13A, in a state in which the display module DM is rolled, the first support parts SPP1 are provided in a folded state, and thus each of the first support parts SPP1 may extend in the first direction DR1 and may be arranged in the second direction DR2.

As illustrated in FIG. 13B, in a state in which the display module DM is unfolded, the first support parts SPP1 are provided in an unfolded state, and thus each of the first support parts SPP1 may extend in the second direction DR2 and may be arranged in the second direction DR2. In an embodiment, in a state in which the display module DM is unfolded, the first lower support bar LSB1 may be disposed to overlap one side of the display module DM extending in the second direction DR2.

The second lower support bar LSB2 may include second support parts SPP2 and second hinge parts HGP2 that connect the second support parts SPP2. Two adjacent second support parts SPP2 may be connected by one second hinge part HGP2. The two adjacent second support parts SPP2 may be unfolded or folded as the holder HD moves.

As illustrated in FIG. 13A, in a state in which the display module DM is rolled, the second support parts SPP2 are provided in a folded state, and thus each of the second support parts SPP2 may extend in the first direction DR1 and may be arranged in the second direction DR2.

As illustrated in FIG. 13B, in a state in which the display module DM is unfolded, the second support parts SPP2 are provided in an unfolded state, and thus each of the second support parts SPP2 may extend in the second direction DR2 and may be arranged in the second direction DR2. In an embodiment, in a state in which the display module DM is unfolded, the second lower support bar LSB2 may be disposed to overlap the other side of the display module DM extending in the second direction DR2.

Figure 15:
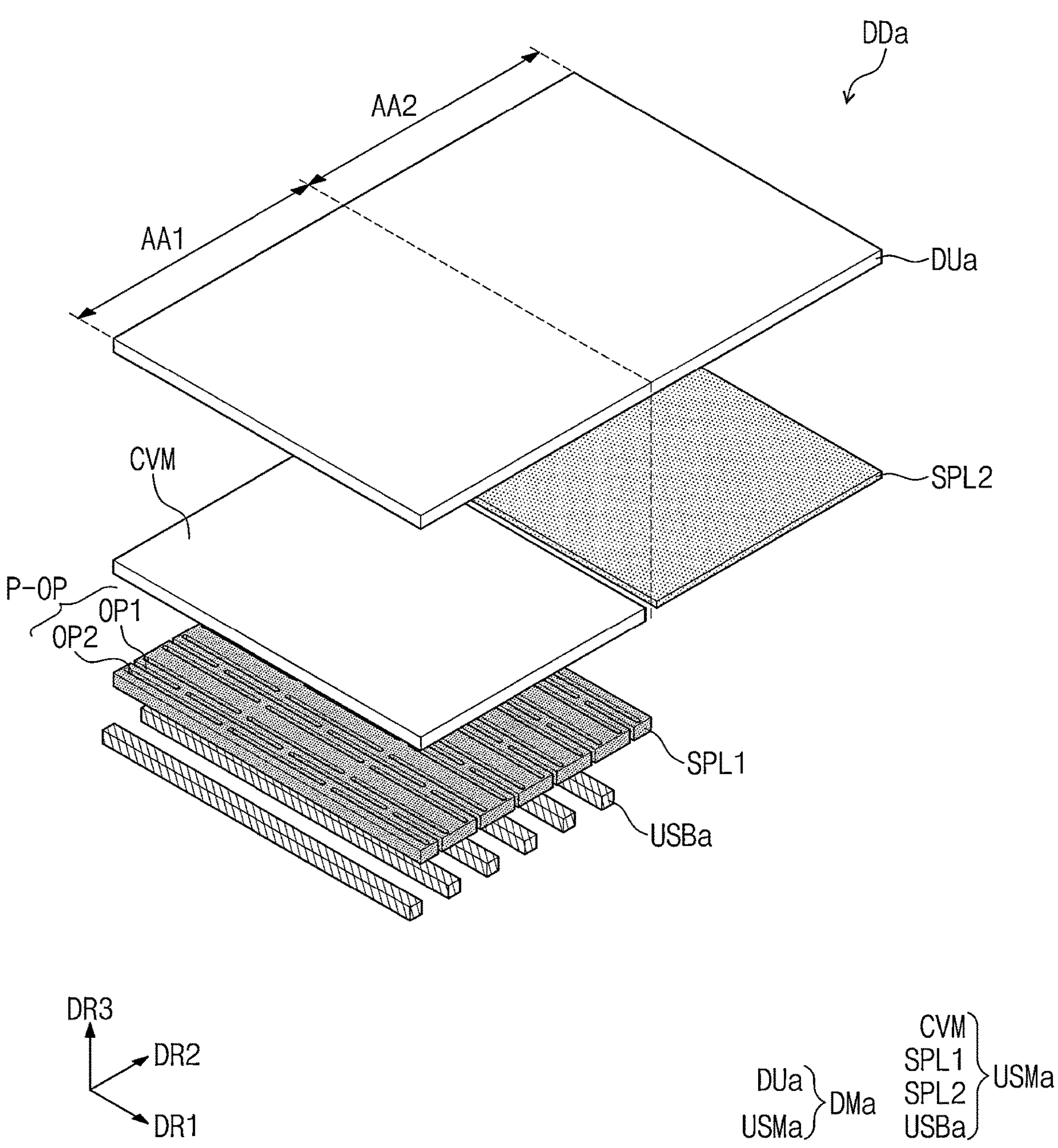
FIG. 15 is an exploded perspective view of an embodiment of the display device according to the disclosure.

FIGS. 14A and 14B are perspective views of an embodiment of an electronic device EDa according to the disclosure. FIG. 15 is an exploded perspective view of partial components of a display device DDa according to the disclosure. The same or similar reference numerals are used for the same or similar components described in FIGS. 1A to 12, a duplicated description thereof will be omitted, and a difference will be mainly described.

Referring to FIGS. 14A and 14B, the electronic device EDa in an embodiment of the disclosure may include the display device DDa and a case CSa in which the display device DDa is accommodated. At least a portion of the display device DDa may be exposed to the outside through an opening C-OPa defined in an upper portion of the case CSa.

The case CSa may include a first case CS1 and a second case CS2. The first case CS1 and the second case CS2 may be coupled to each other to accommodate the display device DDa. The first case CS1 may be coupled to the second case CS2 to move in a direction parallel to the second direction DR2. The first case CS1 may be coupled to the second case CS2 to move closer to or farther from the second case CS2.

Referring to FIGS. 14A and 14B, an area of the display surface DS (refer to FIG. 1A) exposed by the opening C-OPa of the case CSa may be adjusted as the first case CS1 moves. As the first case CS1 moves, an opening area of the opening C-OPa may increase in the second direction DR2.

FIG. 14A illustrates the electronic device EDa in a state (hereinafter, also referred to as a basic mode) in which the first case CS1 is disposed closest to the second case CS2 in the second direction DR2 while the display device DDa operates. FIG. 14B illustrates the electronic device EDa in a state (hereinafter, also referred to as an extended mode) in which the first case CS1 is most spaced apart from the second case CS2 in the second direction DR2 while the display device DDa operates. A user may variously adjust an area of the display surface DS (refer to FIG. 1A) of the display device DDa exposed from the case CSa by selecting any one of the basic mode and the extended mode of the display device DDa.

The display device DDa may be a flexible display device. The display device DDa may be accommodated in the case CSa while folded. As the first case CS1 moves, the area of the display surface DS (refer to FIG. 1A) exposed to the outside may be adjusted. One end of the display device DDa may move in the second direction DR2 together with the first case CS1, and a portion of the display device DDa accommodated in the second case CS2 may be exposed to the outside. Therefore, the display surface DS (refer to FIG. 1A) of the display device DDa exposed through the opening C-OPa may be expanded.

Referring to FIG. 15, the display device DDa in an embodiment may include a display unit DUa and an upper support member USMa.

In an embodiment, the display unit DUa may include a first area AA1 and a second area AA2 extending from the first area AA1 in the second direction DR2. When the basic mode is switched to the extended mode, the first area AA1 of the display unit DUa may move along a curved surface of a roller ROLa (refer to FIGS. 16A and 16B), which will be described below. That is, a portion of the first area AA1 of the display unit DUa may be disposed on the curved surface of the roller ROLa and bent to have a predetermined curvature.

In an embodiment, the upper support member USMa may include a cover member CVM, a first support layer SPL1, a second support layer SPL2, and upper support bars USBa.

The cover member CVM may be disposed below the display unit DUa. The cover member CVM may overlap the first area AA1. The cover member CVM may not overlap the second area AA2. The cover member CVM may protect a rear surface of the display unit DUa corresponding to the first area AA1.

The cover member CVM may include a material having flexibility. In an embodiment, the cover member CVM may include a polymer material, for example. The cover member CVM may support the first area AA1 of the display unit DUa that is bent at a predetermined curvature, thereby relieving a stress caused by the bending. Further, the cover member CVM may prevent foreign substances from entering the display unit DUa through an opening P-OP defined in the first support layer SPL1, which will be described below.

Even during operation in the basic mode and the extended mode, the second area AA2 of the display unit DUa that is not bent does not desire stress relief due to the bending, an opening is not defined in the second support layer SPL2 disposed below the second area AA2 of the display unit DUa, and thus the cover member CVM may not be disposed. Accordingly, a laminate structure of the display device DDa corresponding to the second area AA2 may be simplified.

The first support layer SPL1 may be disposed below the cover member CVM. The first support layer SPL1 may overlap the first area AA1. The first support layer SPL1 may not overlap the second area AA2.

The first support layer SPL1 may include a material having predetermined rigidity. In an embodiment, the first support layer SPL1 may include stainless steel, aluminum, or any alloys thereof, for example. However, the material of the first support layer SPL1 is not limited to the above embodiment. The first support layer SPL1 may improve impact resistance against the first area AA1 of the display unit DUa.

A plurality of openings P-OP passing through the first support layer SPL1 may be defined in the first support layer SPL1. The first support layer SPL1 may be relatively easily bent by the openings P-OP. That is, the first support layer SPL1 may have rigidity, and at the same time, may be easily bent at a predetermined curvature by the openings P-OP.

Each of the openings P-OP may extend in the first direction DR1. That is, a width of the openings P-OP in the first direction DR1 may be greater than a width of the openings P-OP in the second direction DR2. The openings P-OP may be arranged in a lattice shape. Accordingly, a lattice pattern may be formed on the first support layer SPL1 by the openings P-OP.

The openings P-OP may include first openings OP1 and second openings OP2 that are arranged to be offset from each other in a direction parallel to the second direction DR2. The first openings OP1 and the second openings OP2 may be arranged in a row in the first direction DR1. However, this is illustratively illustrated, the plurality of openings P-OP in an embodiment of the disclosure may be all arranged side by side in the second direction DR2, and the disclosure is not limited to an embodiment.

FIG. 15 illustrates that the openings P-OP are provided in plural of groups arranged in the second direction DR2, and one group includes the first openings OP1 provided in one row and the second openings OP2 arranged on opposite sides of the first openings OP1 and provided in two rows. However, this is illustratively illustrated, and an arrangement form and interval of the openings P-OP may be variously designed according to a design of the display device DDa and is not limited to any one design.

The second support layer SPL2 may be disposed below the display unit DUa. The second support layer SPL2 may overlap the second area AA2. The second support layer SPL2 may not overlap the first area AA1. The second support layer SPL2 may be spaced apart from the first support layer SPL1. The second support layer SPL2 may have a plate shape parallel to the first direction DR1 and the second direction DR2. The second support layer SPL2 may protect the rear surface of the display unit DUa corresponding to the second area AA2.

The second support layer SPL2 may include a material having predetermined rigidity. In an embodiment, the second support layer SPL2 may include stainless steel, aluminum, or any alloys thereof, for example. However, the material of the second support layer SPL2 is not limited to the above embodiment. The second support layer SPL2 may include the same material as or a different material from that of the first support layer SPL1. The second support layer SPL2 may support the second area AA2 of the display unit DUa so that the second area AA2 of the display unit DUa maintains a flat state in the basic mode and the extended mode. Further, the second support layer SPL2 may improve impact resistance against the second area AA2 of the display unit DUa.

The second support layer SPL2 may include a different material from that of the cover member CVM. The second support layer SPL2 may have a greater modulus than that of the cover member CVM. The cover member CVM and the second support layer SPL2 are not limited to an embodiment as long as the cover member CVM may support the first area AA1 to relieve the stress caused by the bending and the second support layer SPL2 may evenly support the second area AA2.

The upper support bars USBa may be arranged on a rear surface of the first support layer SPL1. The upper support bars USBa may extend in the first direction DR1. The upper support bars USBa may be spaced apart from each other in the second direction DR2. The upper support bars USBa may be provided as segmented bodies and allow the first area AA1 to be easily bent along a curved surface of the roller ROL (refer to FIGS. 16A and 16B), which will be described below.

The upper support bars USBa may not overlap the openings P-OP of the first support layer SPL1. Therefore, the upper support bars USBa may not degrade bending characteristics of the first support layer SPL1. However, an embodiment is not necessarily limited thereto, and some of the upper support bars USBa may overlap the openings P-OP.

The upper support bars USBa may include a metal having predetermined rigidity. In an embodiment, the upper support bars USBa may include metal such as aluminum, stainless steel, or invar or include a carbon fiber, for example. However, the upper support bars USBa are provided as segmented bodies, and the material of the upper support bars USBa is not limited to above embodiment as long as the upper support bars USBa may support the first area AA1.

Figure 16A:
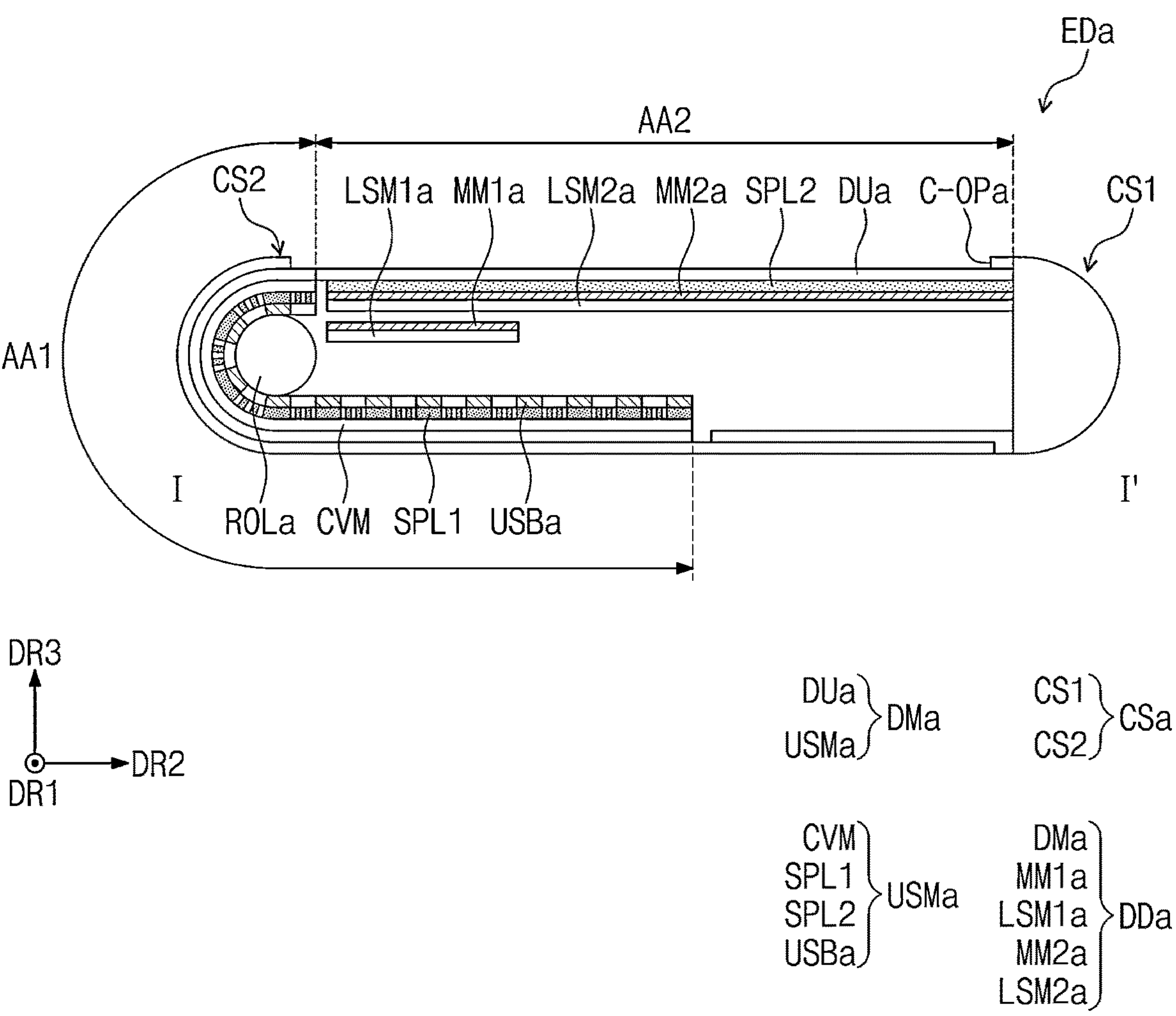
FIG. 16A is a cross-sectional view of an embodiment of the electronic device in an embodiment, which corresponds to line I-I' of FIG. 14A.
Figure 16B:
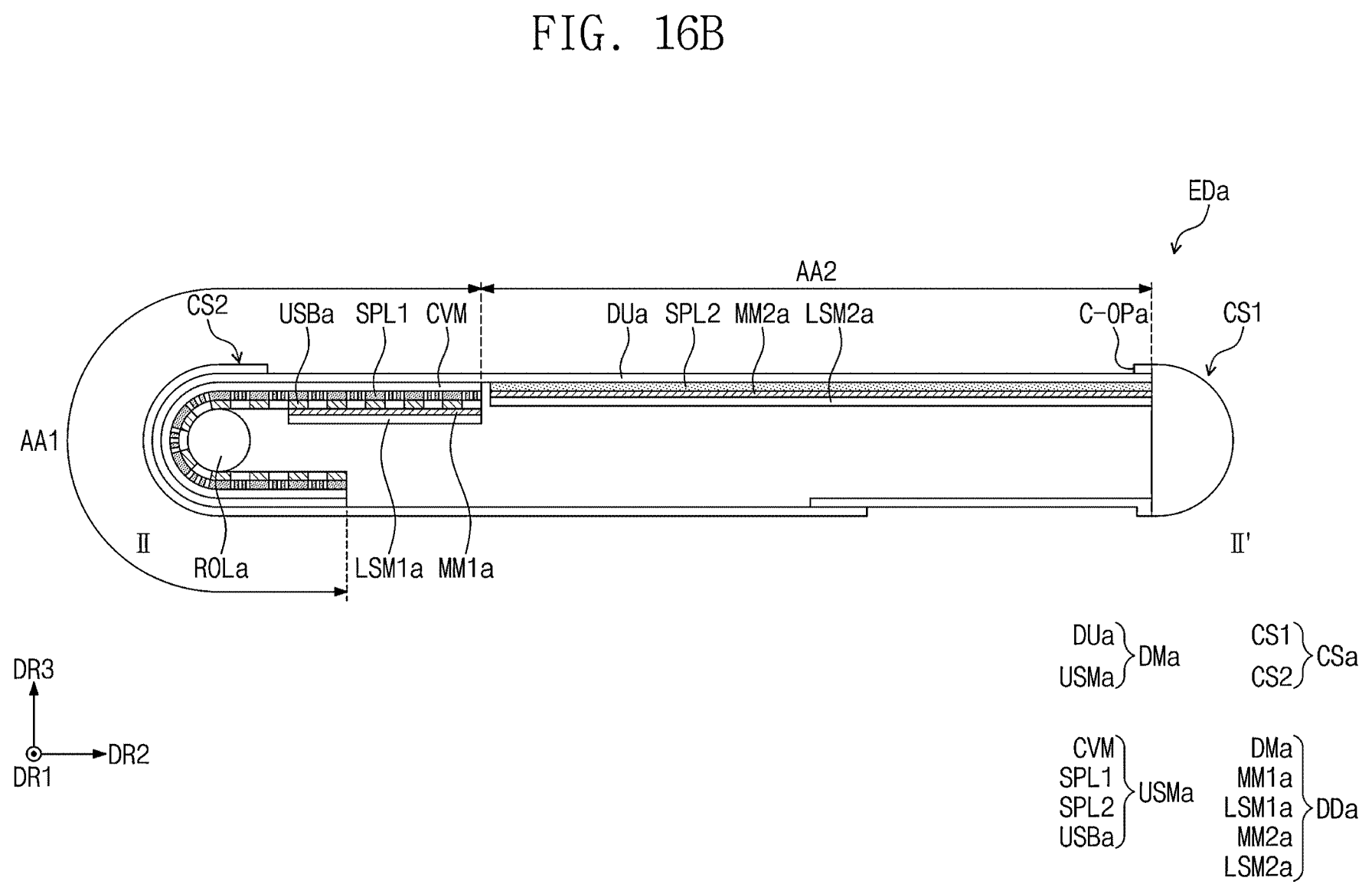

FIG. 16A is a cross-sectional view of an embodiment of the electronic device EDa in an embodiment, which corresponds to line I-I' of FIG. 14A. FIG. 16B is a cross-sectional view of the electronic device EDa in an embodiment, which corresponds to line II-II' of FIG. 14B. That is, FIG. 16A corresponds to a cross section of the electronic device EDa in the basic mode, and FIG. 16B corresponds to a cross section of the electronic device EDa in the extended mode.

Referring to FIGS. 16A and 16B, the electronic device EDa in an embodiment may include the case CSa, the display device DDa accommodated in the case CSa, and the roller ROLa.

In an embodiment, the display device DDa may include a display module DMa, a first intermediate member MM1*a*, a first lower support member LSM1*a*, a second intermediate member MM2*a*, and a second lower support member LSM2*a*. The display module DMa may include the display unit DUa and the upper support member USMa, and the upper support member USMa may include the cover member CVM, the first support layer SPL1, the second support layer SPL2, and the upper support bars USBa. The description made above with reference to FIG. 15 may be equally applied to the description of the display unit DUa and the upper support member USMa.

In the basic mode, the display surface DS (refer to FIG. 1A) corresponding to the second area AA2 may be exposed to the outside. A portion of the first area AA1 may be bent so that an end thereof spaced apart from the second area AA2 overlaps the second area AA2 in the third direction DR3. In the basic mode, a portion of the display surface DS (refer to FIG. 1A) corresponding to the first area AA1 may be exposed to the outside together. However, the disclosure is not limited thereto, and in the basic mode, the display surface DS (refer to FIG. 1A) corresponding to the first area AA1 may not be exposed to the outside.

The roller ROLa may be accommodated in the second case CS2. The roller ROLa may rotate about a rotational axis parallel to the one direction. FIGS. 16A and 16B illustrate the roller ROLa that may rotate about a rotational axis parallel to the first direction DR1. The roller ROLa may be coupled to the second case CS2 and rotate about the rotational axis according to a sliding operation in which the first case CS1 moves away from or approaches the second case CS2.

The first case CS1 of FIG. 16A may move away from the second case CS2 in the second direction DR2 and thus a current mode may be the extended mode illustrated in FIG. 16B. When the electronic device EDa is switched from the basic mode to the extended mode, an end of the display module DMa spaced apart from the first area AA1 and corresponding to the second area AA2 is fixedly coupled to the first case CS1 and thus may move together as the first case CS1 moves. In this case, an end of the display module DMa spaced apart from the second area AA2 and corresponding to the first area AA1 may move in a direction opposite to an end of the second area AA2 coupled to the first case CS1.

A portion of the first area AA1 of the display unit DUa, the cover member CVM supporting the same, the first support layer SPL1, and some of the upper support bars USBa may be arranged on the curved surface of the roller ROLa and bent to have a predetermined curvature. When the basic mode is switched to the extended mode, as the display unit DUa moves, the first area AA1 of the display unit DUa, the cover member CVM, the first support layer SPL1, and the upper support bars USBa may move along the curved surface of the roller ROLa. In an embodiment, in the basic mode, a portion of the display surface DS (refer to FIG. 1A) corresponding to the first area AA1 may be exposed to the outside, and when the basic mode is switched to the extended mode, an area of the first area AA1 exposed to the outside by the opening C-OPa may increase.

As described above with reference to FIGS. 15A and 15B, components that support the first area AA1 bent along the curved surface of the roller ROLa in the basic mode and the extended mode and components that support the second area AA2 maintaining a flat state in the basic mode and the extended mode have different desired mechanical characteristics, and thus the components that support the first area AA1 and the components that support the second area AA2 may be different from each other.

The first lower support member LSM1*a* may be connected to the second case CS2. The first intermediate member MM1*a* may be disposed on the first lower support member LSM1*a*.

When the basic mode is switched to the extended mode, the first lower support member LSM1*a* may be disposed below a portion of the first area AA1 exposed to the outside and a portion of the cover member CVM, a portion of the first support layer SPL1, and portions of the upper support bars USBa that support the same among the display unit DUa. That is, the first lower support member LSM1*a* may support a portion of the display module DMa corresponding to the first area AA1, which provides the display surface DS (refer to FIG. 1A) in the extended mode.

The second lower support member LSM2*a* may be connected to the first case CS1. The second intermediate member MM2*a* may be disposed on the second lower support member LSM2*a*. The second lower support member LSM2*a* and the second intermediate member MM2*a* may move together as the first case CS1 slides.

The second lower support member LSM2*a* may be disposed below the second area AA2 of the display unit DUa and the second support layer SPL2 supporting the second area AA2. That is, the second lower support member LSM2*a* may support the display module DMa corresponding to the second area AA2. Since the display module DMa corresponding to the second area AA2 provides the display surface DS (refer to FIG. 1A) in both the basic mode and the extended mode, the second lower support member LSM2*a* may be provided to support the display module DMa corresponding to the second area AA2 in both the basic mode and the extended mode.

Each of the first and second lower support members LSM1*a* and LSM2*a* may have a predetermined rigidity. In an embodiment, each of the first and second lower support members LSM1*a* and LSM2*a* may include at least one of a metal, a plastic, a carbon fiber, and a glass fiber. Each of the first and second lower support members LSM1*a* and LSM2*a* may include aluminum, stainless steel, invar, a CFRP, a GFRP, or the like, for example. However, the materials of the first and second lower support members LSM1*a* and LSM2*a* are not limited thereto and may include various materials as long as the first and second lower support members LSM1*a* and LSM2*a* may support the display module DM.

The first and second intermediate members MM1*a* and MM2*a* may have lower modulus values that those of the first and second lower support members LSM1*a* and LSM2*a*. Further, the first and second intermediate members MM1*a* and MM2*a* may have lower modulus values that those of the first and second support layers SPL1 and SPL2. In an embodiment, each of the first and second intermediate members MM1*a* and MM2*a* may include a porous material such as sponge and foam. In an embodiment, the sponge may include polyeter, polyvinyl alcohol, and polyester, and the foam may include polyurethane, for example. In an alternative embodiment, each of the first and second intermediate members MM1*a* and MM2*a* may include rubber.

Figure 17A:
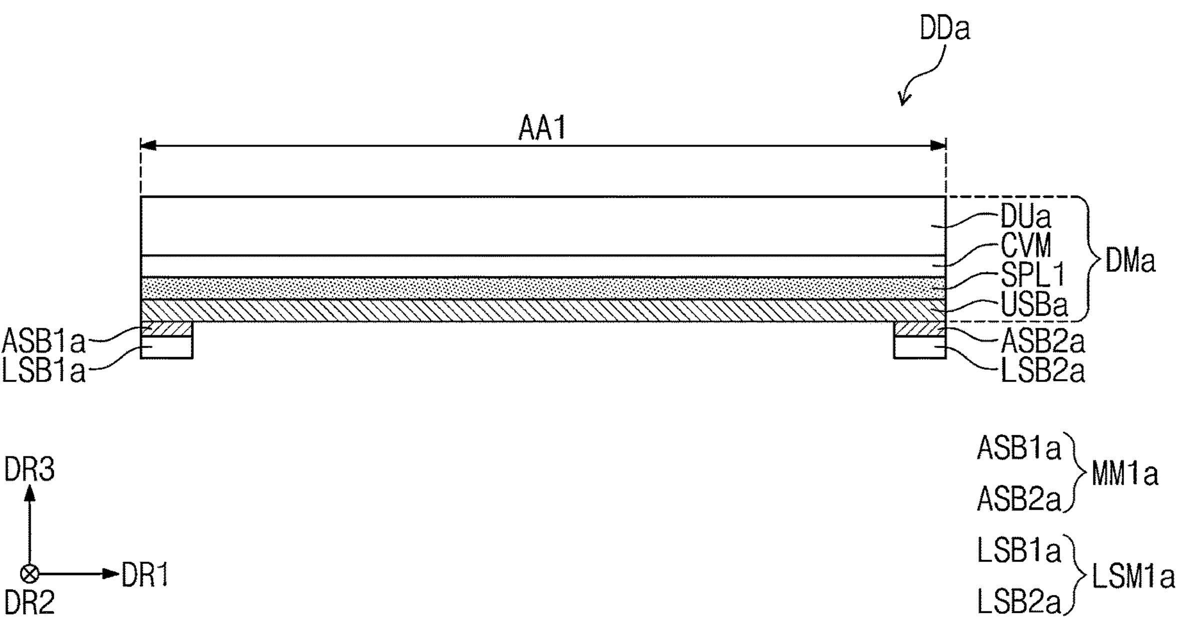
FIGS. 17A and 17B are cross-sectional views of an embodiment of the display device according to the disclosure.
Figure 17B:
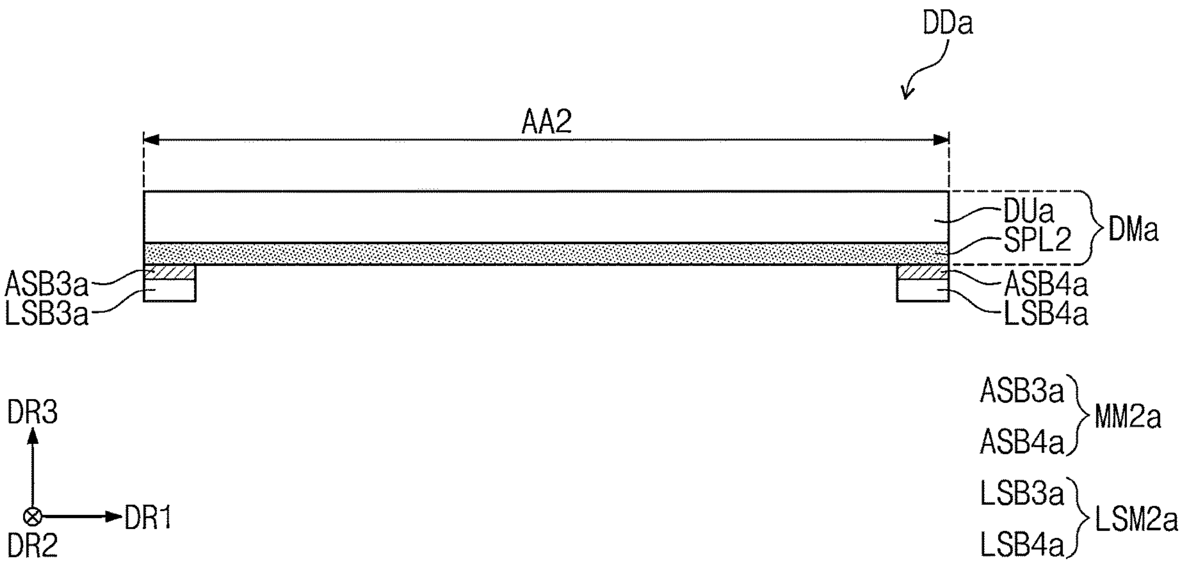

FIGS. 17A and 17B are cross-sectional views of an embodiment of the display device DDa according to the disclosure. FIG. 17A illustrates the display module DMa, the first lower support member LSM1*a*, and the first intermediate member MM1*a* corresponding to the first area AA1 and illustrates a portion of the display module DMa corresponding to the first area AA1, which is supported by the first lower support member LSM1*a* and the first intermediate member MM1*a*, in the extended mode. FIG. 17B illustrates the display module DMa, the second lower support member LSM2*a*, and the second intermediate member MM2*a* corresponding to the second area AA2.

Referring to FIG. 17A, the first lower support member LSM1*a* may include a first lower support bar LSB1*a* and a second lower support bar LSB2*a*. The first lower support bar LSB1*a* and the second lower support bar LSB2*a* may extend in the second direction DR2 and may be spaced apart from each in the first direction DR1.

The first lower support bar LSB1*a* may be disposed adjacent to one side of the display module DMa corresponding to the first area AA1, which extends in the second direction DR2, and the second lower support bar LSB2*a* may be disposed adjacent to the other side of the display module DMa corresponding to the first area AA1, which extends in the second direction DR2. In a cross-section in which the one upper support bar USBa supported by the first lower support member LSM1*a* is cut in the first direction DR1, the first lower support bar LSB1*a* may be adjacent to one end of the one upper support bar USBa, and the second lower support bar LSB2*a* may be adjacent to the other end of the one upper support bar USBa.

In an embodiment, the first lower support bar LSB1*a* may overlap a portion of one side of the display module DMa corresponding to the first area AA1, which extends in the second direction DR2, and the second lower support bar LSB2*a* may overlap a portion of the other side of the display module DMa corresponding to the first area AA1, which extends in the second direction DR2. The first lower support bar LSB1*a* may overlap some of ends of the upper support bars USBa, and the second lower support bar LSB2*a* may overlap some of the other ends of the upper support bars USBa.

The first intermediate member MM1*a* may include a first impact absorbing member ASB1*a* disposed between the upper support bars USBa and the first lower support bar LSB1*a* and a second impact absorbing member ASB2*a* disposed between the upper support bars USBa and the second lower support bar LSB2*a*. The first and second impact absorbing members ASB1*a* and ASB2*a* may be attached to the first and second lower support bars LSB1*a* and LSB2*a*.

In an embodiment, the entirety of the first impact absorbing member ASB1*a* may overlap the first lower support bar LSB1*a*, and the entirety of the second impact absorbing member ASB2*a* may overlap the second lower support bar LSB2*a*. In an embodiment, as illustrated in FIG. 17A, a width of the first impact absorbing member ASB1*a* in the first direction DR1 may be substantially equal to or smaller than a width of the first lower support bar LSB1*a* in the first direction DR1, and a width of the second impact absorbing member ASB2*a* in the first direction DR1 may be substantially equal to or smaller than a width of the second lower support bar LSB2*a* in the first direction DR1, for example.

In an embodiment, the first lower support member LSM1*a* and the first intermediate member MM1*a* may absorb an external impact regardless of a point at which an external impact is applied, and thus impact resistance in the entirety of the area of the display module DMa may be improved. Damage to the display unit DUa from an external impact may be prevented, and thus the bright spot or the dark spot may be prevented from occurring on the display surface DS (refer to FIG. 1A). Accordingly, the display device DDa having improved reliability may be provided.

Referring to FIG. 17B, the second lower support member LSM2*a* may include a third lower support bar LSB3*a* and a fourth lower support bar LSB4*a*. The third lower support bar LSB3*a* and the fourth lower support bar LSB4*a* may extend in the second direction DR2 and may be spaced apart from each in the first direction DR1.

The third lower support bar LSB3*a* may be disposed adjacent to one side of the display module DMa corresponding to the second area AA2, which extends in the second direction DR2, and the fourth lower support bar LSB4*a* may be disposed adjacent to the other side of the display module DMa corresponding to the second area AA2, which extends in the second direction DR2. In a cross-section in which the second support layer SPL2 is cut in the first direction DR1, the third lower support bar LSB3*a* may be disposed adjacent to one end of the second support layer SPL2, and the fourth lower support bar LSB4*a* may be disposed adjacent to the other end of the second support layer SPL2.

In an embodiment, the third lower support bar LSB3*a* may overlap a portion of one side of the display module DMa corresponding to the second area AA2, which extends in the second direction DR2, and the fourth lower support bar LSB4*a* may overlap a portion of the other side of the display module DMa corresponding to the second area AA2, which extends in the second direction DR2.

The second intermediate member MM2*a* may include a third impact absorbing member ASB3*a* disposed between the second support layer SPL2 and the third lower support bar LSB3*a* and a fourth impact absorbing member ASB4*a* disposed between the second support layer SPL2 and the fourth lower support bar LSB4*a*. The third and fourth impact absorbing members ASB3*a* and ASB4*a* may be attached to the third and fourth lower support bars LSB3*a* and LSB4*a*.

In an embodiment, the entirety of the third impact absorbing member ASB3*a* may overlap the third lower support bar LSB3*a*, and the entirety of the fourth impact absorbing member ASB4*a* may overlap the fourth lower support bar LSB4*a*. In an embodiment, as illustrated in FIG. 17B, a width of the third impact absorbing member ASB3*a* in the first direction DR1 may be substantially equal to or smaller than a width of the third lower support bar LSB3*a* in the first direction DR1, and a width of the fourth impact absorbing member ASB4*a* in the first direction DR1 may be substantially equal to or smaller than a width of the fourth lower support bar LSB4*a* in the first direction DR1, for example.

According to the disclosure, in a display device including a display module that may be rolled or bent with respect to a virtual axis extending in one direction, an impact force may be reduced regardless of a position (e.g., a vicinity of a center or a vicinity of an outer portion) in which an external impact is applied. That is, impact resistance in the entirety of the area of the display module may be improved. Accordingly, a display device that may prevent damage to the display module from an external impact, may prevent a bright spot or dark spot from occurring on a display surface, and thus has improved reliability, and an electronic device including the same may be provided.

Although the description has been made above with reference to an embodiment of the disclosure, it may be understood that those skilled in the art or those having ordinary knowledge in the art may variously modify and changes the disclosure without departing from the spirit and technical scope of the disclosure described in the appended claims. Accordingly, the technical scope of the disclosure is not limited to the detailed description of the specification but should be defined by the appended claims.

What is claimed is:

1. An electronic device comprising:

a display module which is rolled or bent with respect to a virtual axis extending in a first direction;

a first lower support bar and a second lower support bar, each of which is disposed below the display module;

a first impact absorbing member disposed between the display module and the first lower support bar; and a second impact absorbing member disposed between the display module and the second lower support bar, the second impact absorbing member separated from the first impact absorbing member by an open space, wherein in a state in which the display module is unfolded, each of the first lower support bar and the second lower support bar extends in a second direction intersecting the first direction, the first lower support bar overlaps a first side of the display module extending in the second direction, and the second lower support bar overlaps a second side of the display module opposite to the first side of the display module and extending in the second direction.

2. The electronic device of claim 1, wherein the first impact absorbing member and the second impact absorbing member have smaller modulus values than modulus values of the first lower support bar and the second lower support bar.

3. The electronic device of claim 1, wherein each of the first impact absorbing member and the second impact absorbing member includes any one of a porous material, rubber, and a spring.

4. The electronic device of claim 1, wherein each of the first lower support bar and the second lower support bar provides inner space, and at least a portion of the first impact absorbing member is disposed in the inner space of the first lower support bar, and at least a portion of the second impact absorbing member is disposed in the inner space of the second lower support bar.

5. The electronic device of claim 1, wherein an entirety of the first impact absorbing member overlaps the first lower support bar, and an entirety of the second impact absorbing member overlaps the second lower support bar.

6. The electronic device of claim 1, wherein, when the display module rolls, the display module includes:

a display panel; and an upper support member disposed below the display panel, and the upper support member includes a base part and upper support bars which contact the base part, extend in the first direction, and are arranged in the second direction.

7. The electronic device of claim 6, wherein an upper surface of each of the upper support bars, a lower surface opposite to the upper surface, and side surfaces which connect the upper surface and the lower surface and extend in the first direction contact the base part.

8. The electronic device of claim 6, wherein an upper surface of each of the upper support bars contacts the base part, and side surfaces of each of the upper support bars extending in the first direction are exposed from the base part.

9. The electronic device of claim 6, wherein the first impact absorbing member and the second impact absorbing member have smaller modulus values than modulus values of the base part.

10. The electronic device of claim 1, wherein, when the display module rolls, the first lower support bar includes support parts and at least one hinge part connecting the support parts, in a state in which the display module is rolled, each of the support parts extend in the first direction and the support parts are arranged in the second direction, and in the state in which the display module is unfolded, each of the support parts extend in the second direction and the support parts are arranged in the second direction.

11. The electronic device of claim 1, wherein, when the display module rolls, each of the first impact absorbing member and the second impact absorbing member is attached to the display module and rolls together with the display module.

12. The electronic device of claim 1, wherein, when the display module is bent, the display module includes a first area bent with respect to the virtual axis extending in the first direction and a second area which extends from the first area and is flat and includes a display panel and an upper support member disposed below the display panel, the upper support member includes:

a first support layer defining openings therein and overlapping the first area;

a second support layer overlapping the second area; and upper support bars which extend in the first direction, are arranged in the second direction, overlap the first area, and are arranged below the first support layer, and in the state in which the display module is unfolded, the first and second lower support bars and the first and second impact absorbing members overlap the first area.

13. The electronic device of claim 12, further comprising:

a third lower support bar and a fourth lower support bar which overlap the second area, are arranged below the second support layer, and extend in the second direction;

a third impact absorbing member disposed between the display module and the third lower support bar; and a fourth impact absorbing member disposed between the display module and the fourth lower support bar, wherein the third lower support bar overlaps a first side of the display module in the second area, the first side of the display module in the second area extends in the second direction, the fourth lower support bar overlaps a second side of the display module in the second area, and the second side of the display module is opposite to the first side of the display module and extends in the second direction.

14. The electronic device of claim 13, further comprising:

a case; and a roller which is disposed inside the case and rotates about the virtual axis and to which one side of the display module is connected, wherein the case includes:

a first case in which the roller is accommodated; and a second case which is coupled to the first case and moves closer to or farther from the first case, the first lower support bar and the second lower support bar are connected to the first case, and the third lower support bar and the fourth lower support bar are connected to the second case.

15. An electronic device comprising:

a display panel which is rolled or bent with respect to a virtual axis extending in a first direction;

an upper support member disposed below the display panel and including a plurality of upper support bars extending in the first direction and arranged in a second direction intersecting the first direction;

a first lower support bar and a second lower support bar, each of which is disposed below the upper support member;

a first impact absorbing member disposed between the upper support member and the first lower support bar; and a second impact absorbing member disposed between the upper support member and the second lower support bar, wherein in a state in which the display panel is unfolded, each of the first lower support bar and the second lower support bar extends in the second direction, the first lower support bar overlaps at least some of one ends of the plurality of upper support bars, and the second lower support bar overlaps some of the other ends of the plurality of upper support bars.

16. The electronic device of claim 15, wherein the first impact absorbing member and the second impact absorbing member have smaller modulus values than modulus values of the first lower support bar and the second lower support bar.

17. The electronic device of claim 15, wherein each of the first impact absorbing member and the second impact absorbing member includes any one of a porous material, rubber, and a spring.

18. The electronic device of claim 15, wherein an entirety of the first impact absorbing member overlaps the first lower support bar, and an entirety of the second impact absorbing member overlaps the second lower support bar.

19. The electronic device of claim 15, wherein, when the display panel rolls, the upper support member further includes a base part of which at least a portion is disposed on the plurality of upper support bars and which contacts the plurality of upper support bars, and the plurality of upper support bars have greater modulus values than a modulus value of the base part.

20. The electronic device of claim 15, wherein, when the display panel is bent, the display panel includes a first area bent with respect to the virtual axis extending in the first direction and a second area which extends from the first area and is flat, the plurality of upper support bars overlapping the first area, the upper support member further includes:

a first support layer having openings defined therein, overlapping the first area, and disposed on the plurality of upper support bars; and a second support layer overlapping the second area, and in a state in which the display panel is unfolded, each of the first and second lower support bars and the first and second impact absorbing members overlaps the first area.

* * * * *